(12) United States Patent
Kankar et al.

(10) Patent No.: US 11,323,097 B2
(45) Date of Patent: May 3, 2022

(54) BULK ACOUSTIC WAVE FILTERS ON SHARED DIE

(71) Applicant: Skyworks Solutions, Inc., Irvine, CA (US)

(72) Inventors: Akshara Kankar, Irvine, CA (US); Tomoya Komatsu, Irvine, CA (US); Abhishek Dey, Greensboro, NC (US); Nan Wu, Irvine, CA (US); Stephane Richard Marie Wloczysiak, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 38 days.

(21) Appl. No.: 16/937,472

(22) Filed: Jul. 23, 2020

(65) Prior Publication Data

US 2021/0044278 A1 Feb. 11, 2021

Related U.S. Application Data

(60) Provisional application No. 62/878,135, filed on Jul. 24, 2019, provisional application No. 62/878,209, (Continued)

(51) Int. Cl.
*H03H 9/70* (2006.01)
*H03H 9/02* (2006.01)
(Continued)

(52) U.S. Cl.
CPC .............. *H03H 9/706* (2013.01); *H03F 3/19* (2013.01); *H03H 3/02* (2013.01);
(Continued)

(58) Field of Classification Search
CPC ...... H03H 9/706; H03H 3/02; H03H 9/02118; H03H 9/0523; H03H 9/0542; H03H 9/105;
(Continued)

(56) References Cited

U.S. PATENT DOCUMENTS 8,680,944 B2 3/2014 Ye et al.
2007/0267942 A1 11/2007 Matsumoto et al.
(Continued)

FOREIGN PATENT DOCUMENTS

JP 2019-154031 A 9/2019
JP 2020-109958 A 7/2020
(Continued)

OTHER PUBLICATIONS

Wang et al., Method of Fabricating Multiple-frequency Film Bulk Acoustic Resonator (FBARs) in a Single Chip, 2006, IEEE Frequency Control Symposium Digest, p. 179 (Year: 2006).*
(Continued)

*Primary Examiner* — Hafizur Rahman
(74) *Attorney, Agent, or Firm* — Knobbe, Martens, Olson & Bear, LLP

(57) ABSTRACT

Bulk acoustic wave resonators of two or more different filters can be on a common die. The two filters can be included in a multiplexer, such as a duplexer, or implemented as standalone filters. With bulk acoustic wave resonators of two or more filters on the same die, the filters can be implemented in less physical space compared to implementing the same filters of different die. Related methods, radio frequency systems, radio frequency modules, and wireless communication devices are also disclosed.

20 Claims, 24 Drawing Sheets

Related U.S. Application Data filed on Jul. 24, 2019, provisional application No. 62/878,189, filed on Jul. 24, 2019.

(51) Int. Cl.

| | |
|---|---|
| *H03H 9/05* | (2006.01) |
| *H03H 9/10* | (2006.01) |
| *H03H 9/17* | (2006.01) |
| *H03H 9/56* | (2006.01) |
| *H03F 3/19* | (2006.01) |
| *H03H 3/02* | (2006.01) |
| *H04B 1/38* | (2015.01) |

(52) U.S. Cl.
CPC ...... *H03H 9/02118* (2013.01); *H03H 9/0523* (2013.01); *H03H 9/0542* (2013.01); *H03H 9/105* (2013.01); *H03H 9/173* (2013.01); *H03H 9/176* (2013.01); *H03H 9/562* (2013.01); *H03H 9/564* (2013.01); *H03H 9/568* (2013.01); *H03F 2200/294* (2013.01); *H03F 2200/451* (2013.01); *H03H 2003/021* (2013.01); *H04B 1/38* (2013.01)

(58) Field of Classification Search
CPC ........ H03H 9/173; H03H 9/176; H03H 9/562; H03H 9/564; H03H 9/568; H03H 2003/021; H03F 3/19; H03F 2200/294; H03F 2200/451; H04B 1/38
USPC ........................................................ 330/250
See application file for complete search history.

(56) References Cited

U.S. PATENT DOCUMENTS

| | | | |
|---|---|---|---|
| 2008/0024042 A1 | 1/2008 | Isobe et al. | |
| 2008/0129412 A1* | 6/2008 | Osone | H03H 9/589 |
| | | | 333/133 |
| 2011/0102099 A1 | 5/2011 | Shin et al. | |
| 2012/0182087 A1* | 7/2012 | Ye | H03H 9/0571 |
| | | | 333/133 |
| 2016/0252606 A1 | 9/2016 | Storz | |
| 2017/0126206 A1 | 5/2017 | Nguyen et al. | |
| 2017/0264257 A1* | 9/2017 | Reinhardt | H03H 9/725 |
| 2018/0226945 A1* | 8/2018 | Kim | H03H 9/605 |
| 2019/0273478 A1 | 9/2019 | Lin et al. | |
| 2019/0273479 A1 | 9/2019 | Caron et al. | |
| 2019/0273480 A1 | 9/2019 | Lin et al. | |
| 2020/0212878 A1 | 7/2020 | Shin et al. | |
| 2020/0212882 A1 | 7/2020 | Shin et al. | |
| 2020/0212884 A1 | 7/2020 | Shin et al. | |
| 2020/0227470 A1* | 7/2020 | Then | H01L 27/20 |
| 2021/0105005 A1 | 4/2021 | Kankar et al. | |
| 2021/0105006 A1 | 4/2021 | Kankar et al. | |

FOREIGN PATENT DOCUMENTS

| | | | | |
|---|---|---|---|---|
| SG | 10201901768 | 10/2019 | | |
| TW | 201941464 | 10/2019 | | |
| WO | WO-2016117676 A1 * | 7/2016 | ............ | H03H 9/64 |
| WO | WO 2019/169025 A1 | 9/2019 | | |

OTHER PUBLICATIONS

Aigner et al., Bulk-Acoustic Wave Filters: Performance Optimization and Volume Manufacturing, 2003 IEEE MTT-S Digest, pp. 2001-2004 (Year: 2003).*

Reinhardt et al., "Multiple frequency Solidly Mounted BAW filters", ResearchGate, https://www.researchgate.net/publication/252027205, (May 2011).

International Preliminary Report on Patentability issued in application No. PCT/US2019/019884 dated Sep. 8, 2020.

International Search Report issued in application No. PCT/US2019/019884 dated Jun. 14, 2019.

Written Opinion issued in application No. PCT/US2019/019884 dated Jun. 14, 2019.

* cited by examiner

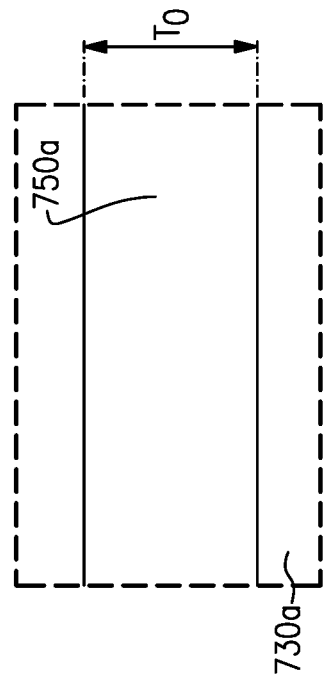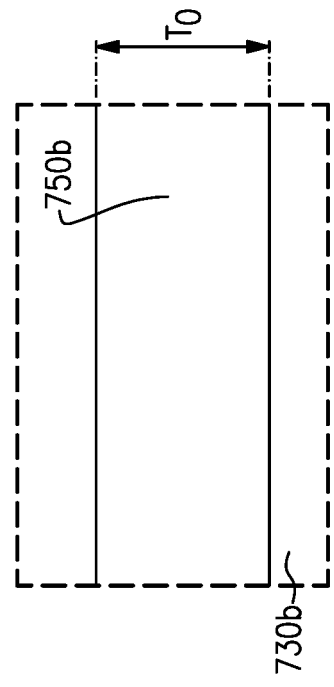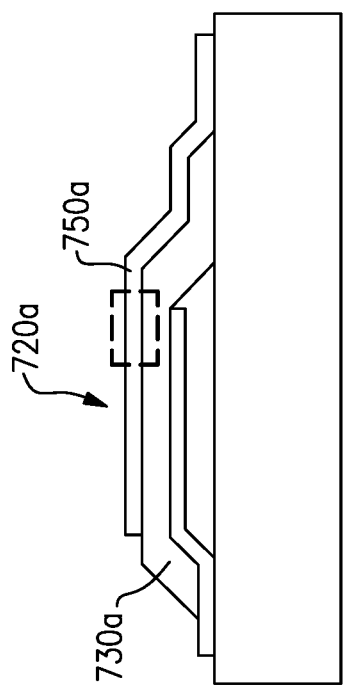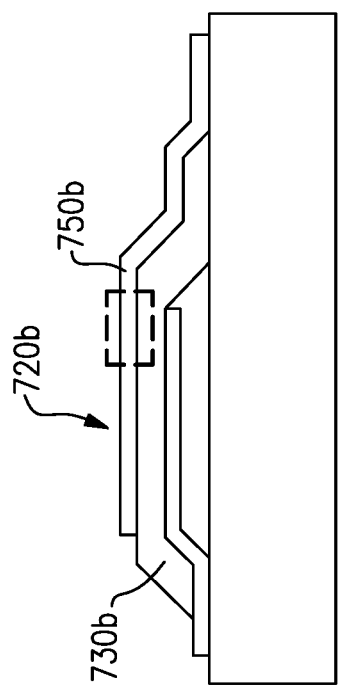
FIG.7A
FIG.7B

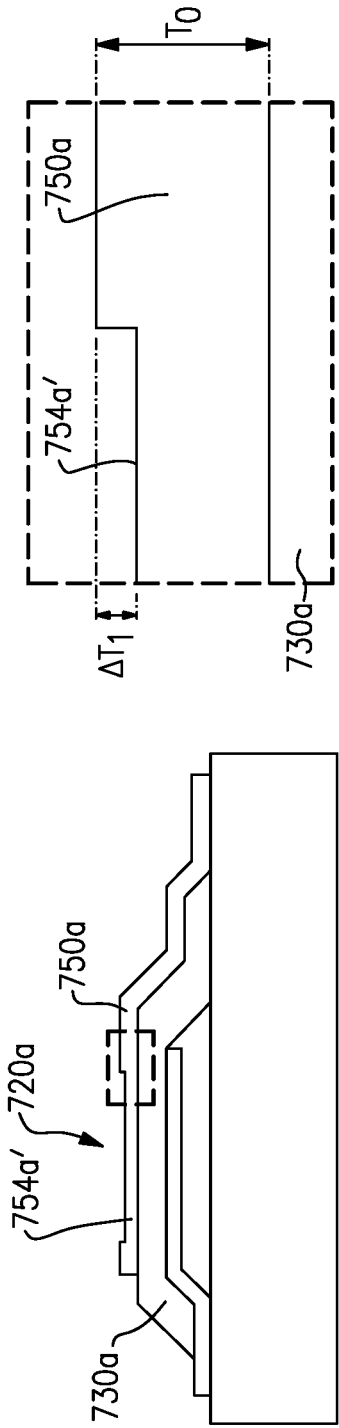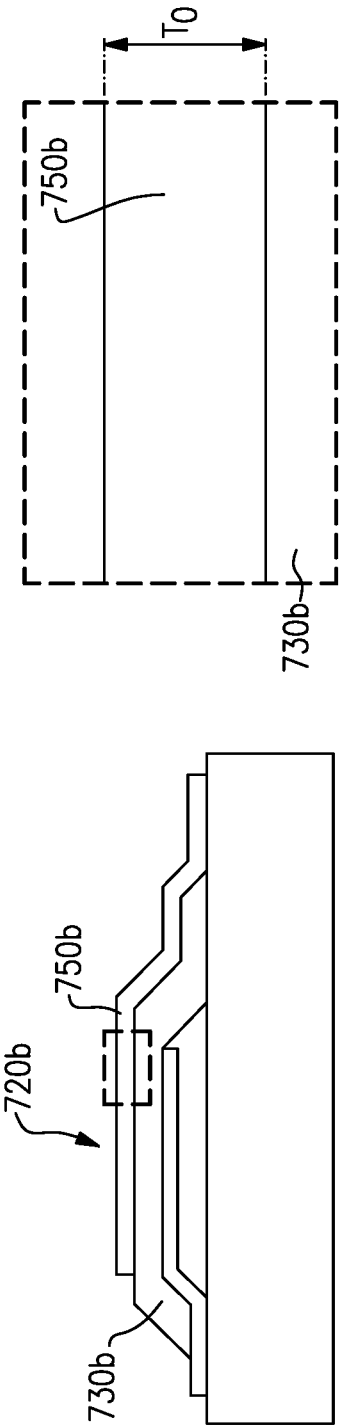

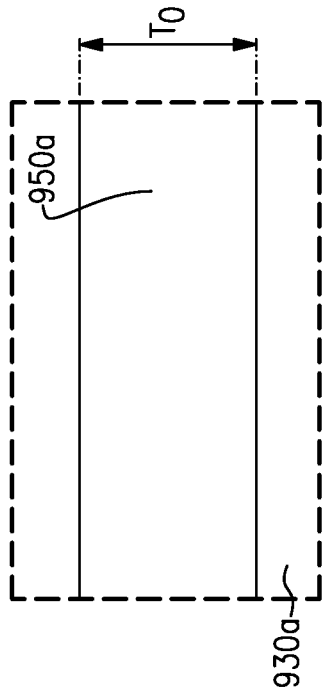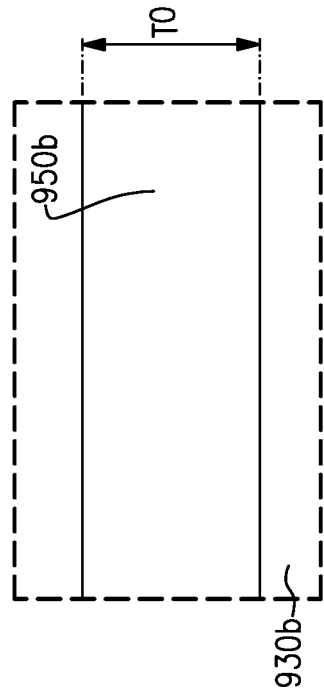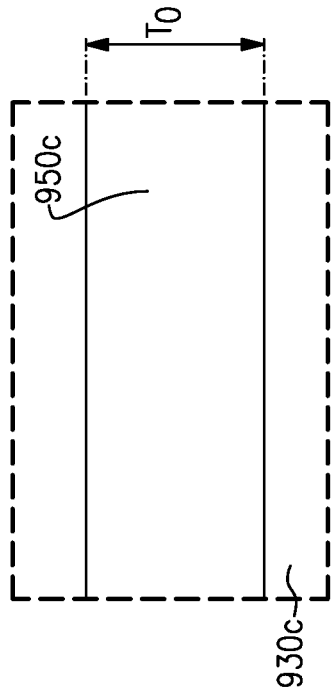
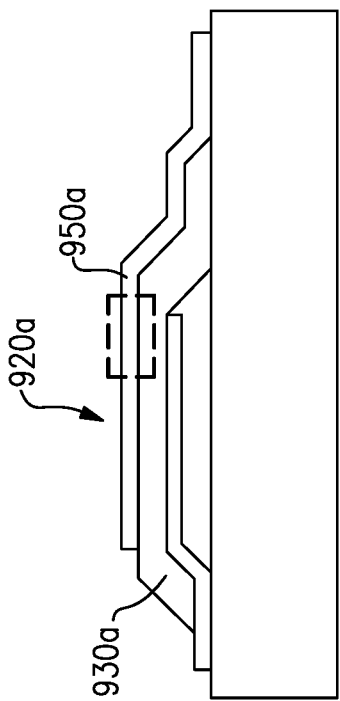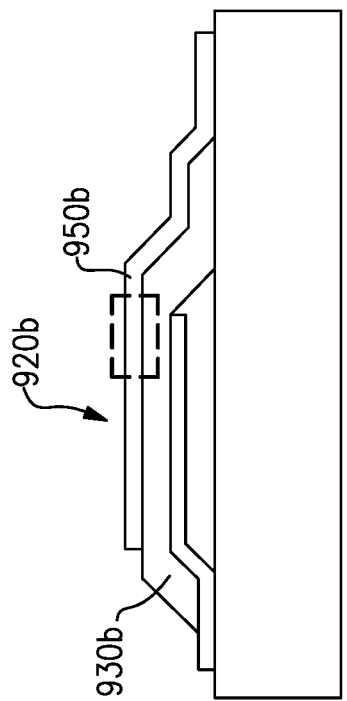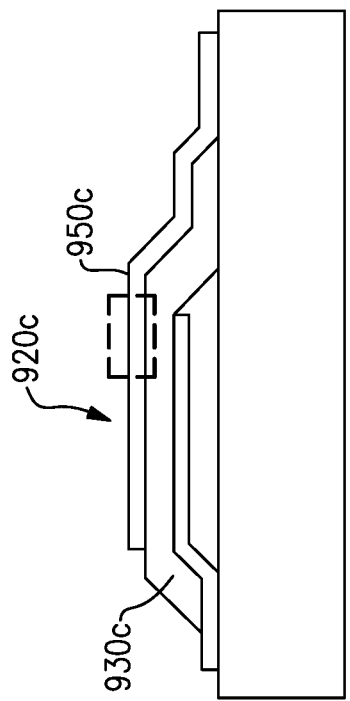
FIG.9A  FIG.9B  FIG.9C

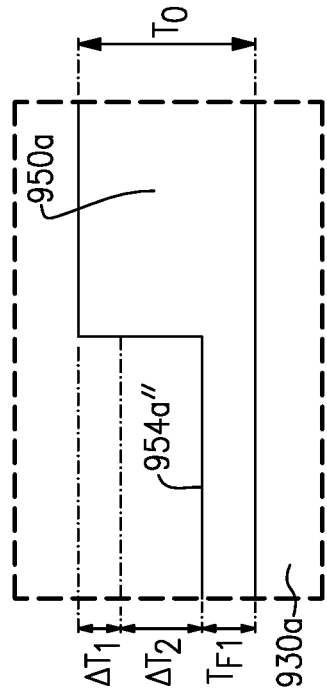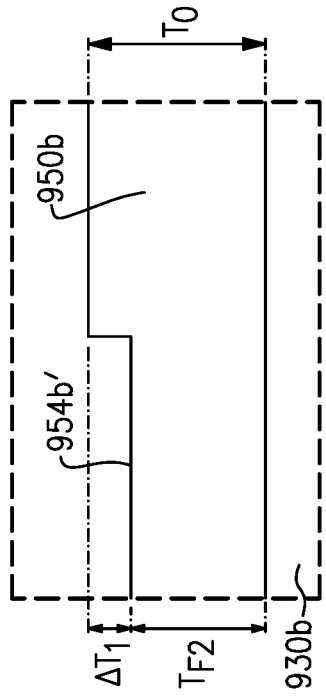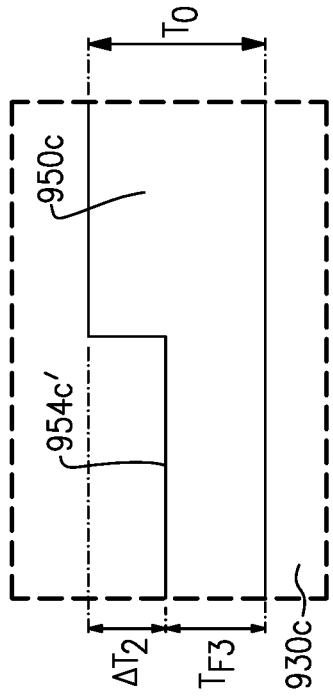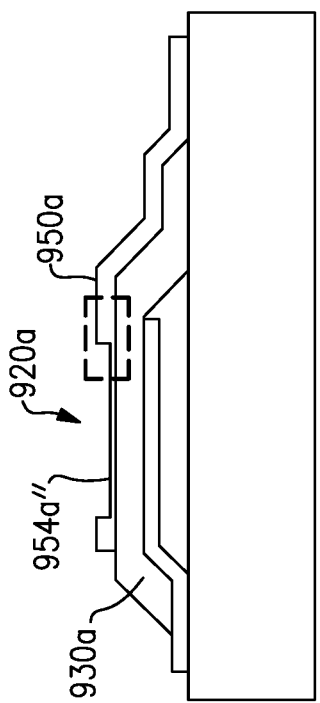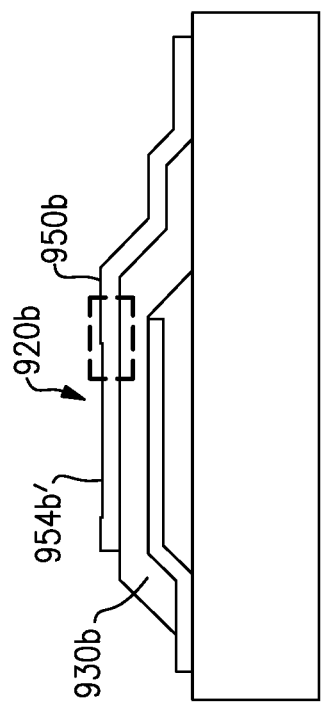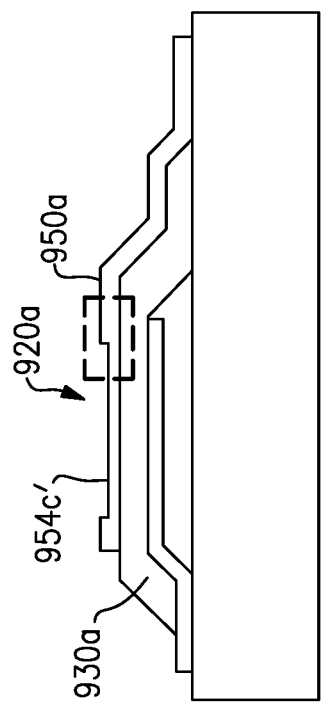
FIG.9G   FIG.9H   FIG.9I

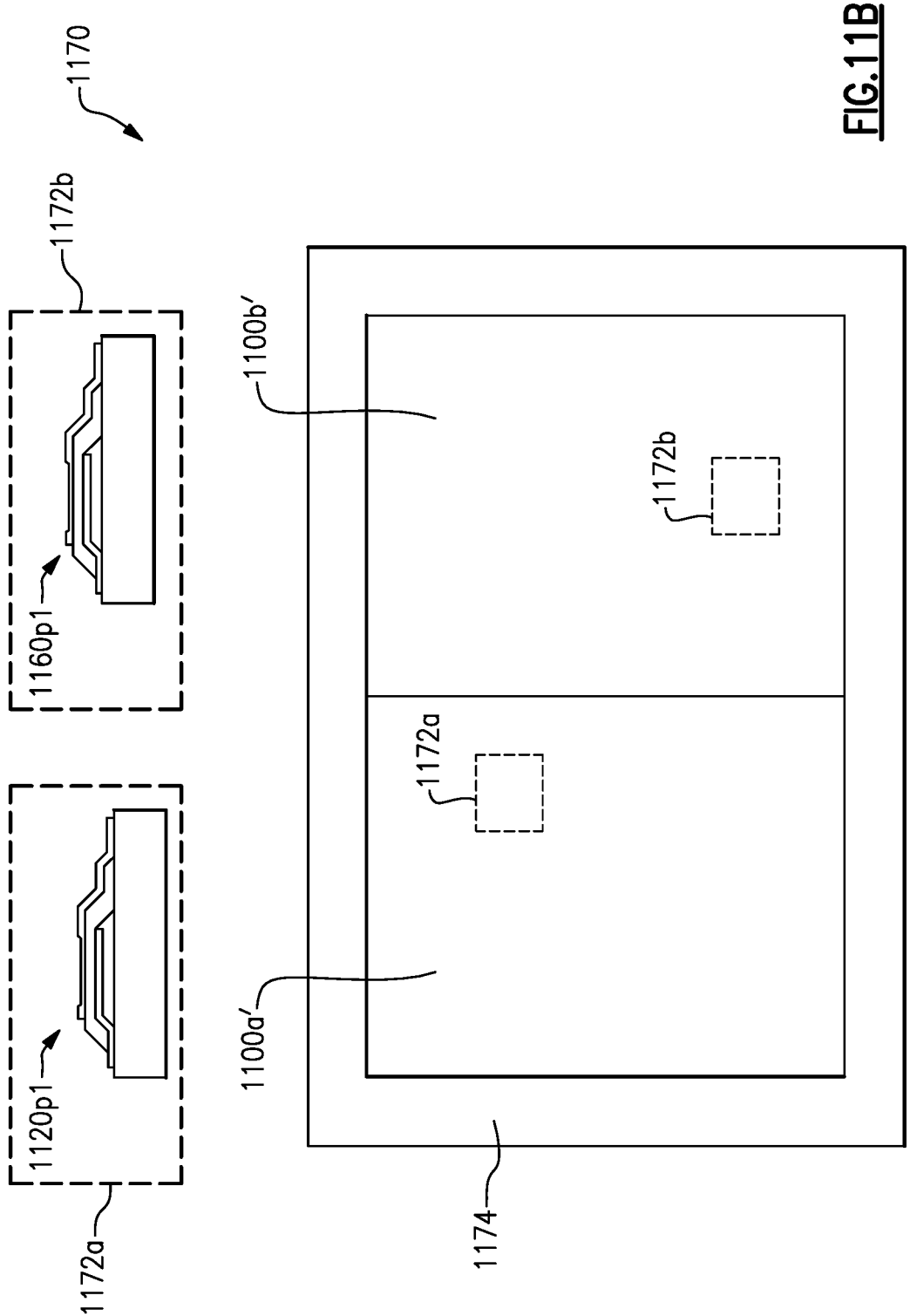

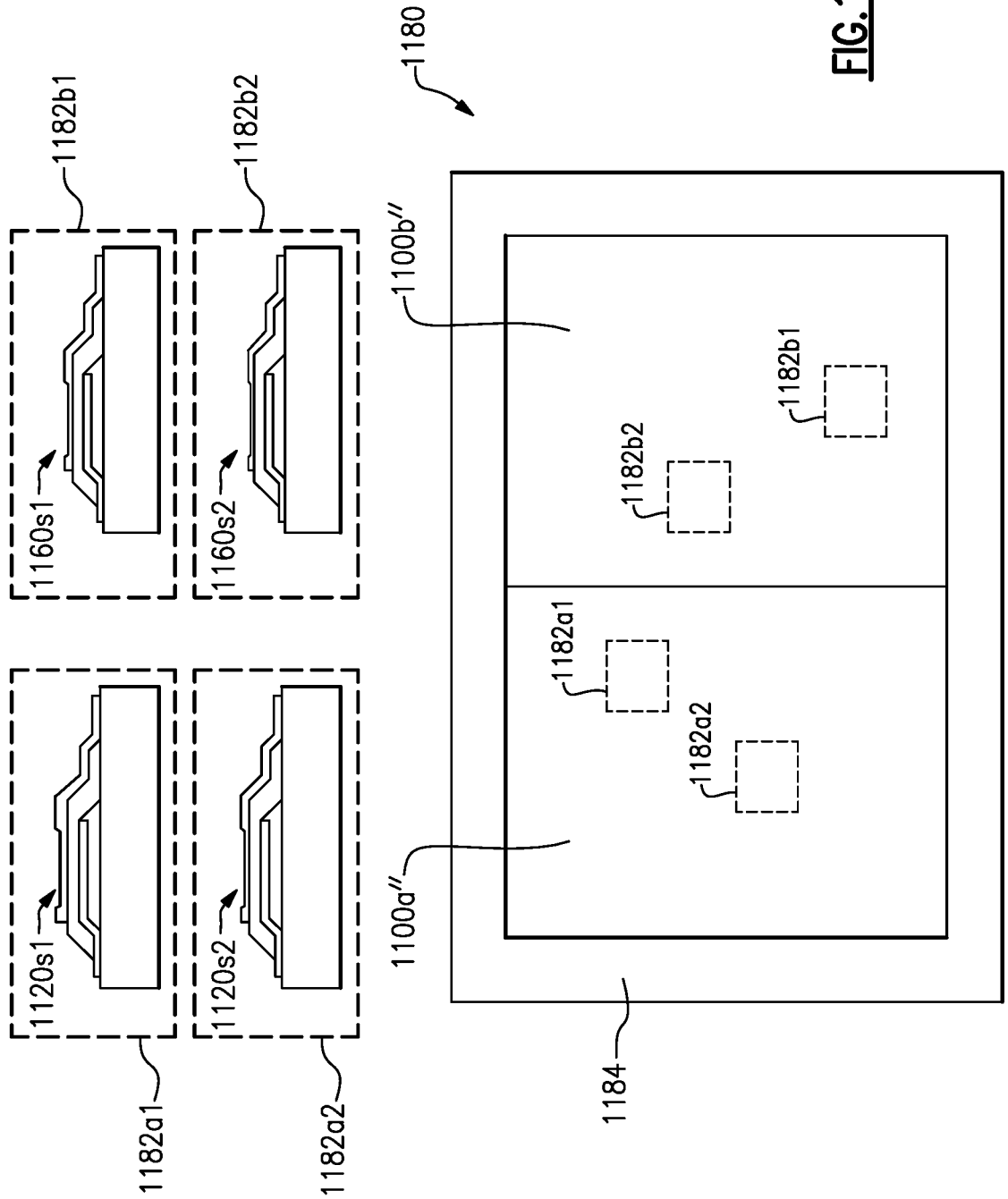

BULK ACOUSTIC WAVE FILTERS ON SHARED DIE

CROSS REFERENCE TO PRIORITY APPLICATIONS

Any and all applications for which a foreign or domestic priority claim is identified in the Application Data Sheet as filed with the present application are hereby incorporated by reference under 37 CFR § 1.57. This application claims the benefit of priority of U.S. Provisional Patent Application No. 62/878,135, filed Jul. 24, 2019 and titled "METHOD FOR FORMING MULTIPLE BULK ACOUSTIC WAVE FILTERS ON SHARED DIE," U.S. Provisional Patent Application No. 62/878,209, filed Jul. 24, 2019 and titled "BULK ACOUSTIC WAVE FILTERS ON SHARED DIE," and U.S. Provisional Patent Application No. 62/878,189, filed Jul. 24, 2019 and titled "BULK ACOUSTIC WAVE FILTER CO-PACKAGE," the disclosures of each which are hereby incorporated by reference in their entireties herein.

BACKGROUND

Technical Field

Embodiments of this disclosure relate to acoustic wave devices, for example, bulk acoustic wave devices.

Description of Related Technology

Acoustic wave filters can be implemented in radio frequency electronic systems. For instance, filters in a radio frequency front end of a mobile phone can include one or more acoustic wave filters. A plurality of acoustic wave filters can be arranged as a multiplexer. For instance, two acoustic wave filters can be arranged as a duplexer.

With the explosive growth of mobile communication, the frequency spectrum is becoming crowded. This can generate demanding specifications for radio frequency (RF) filters and duplexers with steep roll-off, low temperature drift, low insertion loss, miniature size, the like, or any combination thereof.

An acoustic wave filter can include a plurality of resonators arranged to filter a radio frequency signal. Example acoustic wave filters include surface acoustic wave (SAW) filters and bulk acoustic wave (BAW) filters. Example BAW resonators include film bulk acoustic wave resonators (FBARs) and solidly mounted resonators (SMRs). In BAW filters, acoustic waves propagate in a bulk of a piezoelectric layer. A SAW filter can include an interdigital transductor electrode on a piezoelectric substrate and can generate a surface acoustic wave on a surface of the piezoelectric layer on which the interdigital transductor electrode is disposed.

SUMMARY

The innovations described in the claims each have several aspects, no single one of which is solely responsible for its desirable attributes. Without limiting the scope of the claims, some prominent features of this disclosure will now be briefly described.

One aspect of this disclosure is a multi-filter die with bulk acoustic wave filters. The multi-filter die includes a first filter located in a first region of a substrate and a second filter located in a second region of the substrate. The first filter includes a first plurality of bulk acoustic wave resonators. The second filter includes a second plurality of bulk acoustic wave resonators. At least one of the first plurality of bulk acoustic wave resonators has the same resonant frequency as at least one of the second plurality of bulk acoustic wave resonators.

The first and second filters can be included in a multiplexer. The first and second filters can be electrically connected to one another at a common contact by at least one electrical connection of the multi filter die.

The multi-filter die can be free from electrical connections between the first filter and the second filter.

The first plurality of bulk acoustic wave resonators and the second plurality of bulk acoustic wave resonators can be film bulk acoustic wave resonators.

The first plurality of bulk acoustic wave resonators can each include a raised frame structure.

The first filter can be a first band pass filter having a first passband, the second filter can be a second band pass filter having a second passband, and the first passband can overlap with the second passband.

The first filter and the second filter can include a common material stack. A thickness of a piezoelectric layer of the one of the first plurality of bulk acoustic wave resonators can be the same as a thickness of a piezoelectric layer of the one of the second plurality of bulk acoustic wave resonators. A thickness of a lower electrode of the one of the first plurality of bulk acoustic wave resonators can be the same as a thickness of a lower electrode of the one of the second plurality of bulk acoustic wave resonators. The lower electrode of the one of the first plurality of bulk acoustic wave resonators can include a same material as the lower electrode of the one of the second plurality of bulk acoustic wave resonators.

The first filter and the second filter can share a common frequency range.

Another aspect of this disclosure is a multi-filter die with bulk acoustic wave filters. The multi-filter die includes a first filter located in a first region of a substrate and a second filter located in a second region of the substrate. The first filter includes a first plurality of bulk acoustic wave resonators. Each of the first plurality of bulk acoustic wave resonators has a resonant frequency. The second filter includes a second plurality of bulk acoustic wave resonators. Each of the second plurality of bulk acoustic wave resonators has a resonant frequency. A difference between resonant frequencies of two bulk acoustic wave resonators of the first plurality of bulk acoustic wave resonators is equal to a difference between resonant frequencies of two bulk acoustic wave resonators of the second plurality of bulk acoustic wave resonators.

In some instances, each of resonant frequencies of the first plurality of bulk acoustic wave resonators can be different from each of the resonant frequencies of the second plurality of bulk acoustic wave resonators.

The first and second filters can be included in a multiplexer.

The multi-filter die can be free from electrical connections between the first filter and the second filter.

The first plurality of bulk acoustic wave resonators and the second plurality of bulk acoustic wave resonators can be film bulk acoustic wave resonators.

The first plurality of bulk acoustic wave resonators can each include a raised frame structure.

The first filter can be a first band pass filter having a first passband, the second filter can be a second band pass filter having a second passband, and the first passband can overlap with the second passband.

The first filter and the second filter can be formed using a common material stack.

The first filter and the second filter can share a common frequency range.

Another aspect of this disclosure is a radio frequency system that includes a radio frequency amplifier, a multi-filter die including a first filter in a first region of a substrate and a second filter in a second region of the substrate, and a switch configured to selectively electrically connect the radio frequency amplifier and the first filter. The first filter includes a first plurality of bulk acoustic wave resonators. The second filter includes a second plurality of bulk acoustic wave resonators. At least one of the first plurality of bulk acoustic wave resonators has the same resonant frequency as at least one of the second plurality of bulk acoustic wave resonators.

The radio frequency amplifier can be a power amplifier. Alternatively, the radio frequency amplifier can be a low noise amplifier.

Another aspect of this disclosure is a multi-filter die with bulk acoustic wave filters. The multi-filter die includes a first filter supported by a substrate, the first filter including a first plurality of bulk acoustic wave resonators, each of the first plurality of bulk acoustic wave resonators having one of a first plurality of resonant frequencies; and a second filter located in a second region of the substrate, the second filter including a second plurality of bulk acoustic wave resonators, each of the second plurality of bulk acoustic wave resonators having one of a second plurality of resonant frequencies, the resonant frequencies of least a portion of the first plurality of bulk acoustic wave resonators and at least a portion of the second plurality of bulk acoustic wave resonators having been concurrently adjusted by a common trimming process.

At least one of the first plurality of resonant frequencies can be equal to at least one of the second plurality of resonant frequencies. A difference between a first resonant frequency and a second resonant frequency of the first plurality of resonant frequencies can be equal to a difference between a first resonant frequency and a second resonant frequency of the second plurality of resonant frequencies. None of the first plurality of resonant frequencies may be equal to any of the second plurality of resonant frequencies.

The first filter and the second filter can share a common frequency range.

The first filter and the second filter can be formed using a common material stack.

Another aspect of this disclosure is a multi-filter die with bulk acoustic wave filters. The multi-filter die includes: a first filter located in a first region of a substrate, the first filter including a first plurality of bulk acoustic wave resonators; and a second filter located in a second region of the substrate, the second filter including a second plurality of bulk acoustic wave resonators.

The first and second filters can be included in a multiplexer. The first and second filters can be electrically connected to one another at a common contact by at least one electrical connection internal to and/or supported by the multi-filter die.

The multi-filter die can be free from electrical connections between the first and second filters. The first filter die can be in electrical communication with a first discrete input/output contact and a second discrete input/output contact and the second filter can be in electrical communication with a third discrete input/output contact and a fourth discrete input/output contact.

The first filter and the second filter can share a common frequency range.

The first filter and the second filter can be formed by a process that includes at least one shared trimming step.

The first filter and the second filter can be formed using a common material stack.

Each of the first plurality of bulk acoustic wave resonators and each of the second plurality of bulk acoustic wave resonators can include a piezoelectric layer, an upper electrode, and a lower electrode, the upper electrode and the lower electrode located on opposite sides of the piezoelectric layer. The piezoelectric layers of the first plurality of bulk acoustic wave resonators can include the same piezoelectric material as the piezoelectric layers of the second plurality of bulk acoustic wave resonators. A thickness of the piezoelectric layers of the first plurality of bulk acoustic wave resonators can be the same as a thickness of the piezoelectric layers of the second plurality of bulk acoustic wave resonators. Lower electrodes of the first plurality of bulk acoustic wave resonators can include the same material as the lower electrodes of the second plurality of bulk acoustic wave resonators. A thickness of the lower electrodes of the first plurality of bulk acoustic wave resonators can be the same as a thickness of the lower electrodes of the second plurality of bulk acoustic wave resonators.

The two filters can be co-packaged in a single package.

Another aspect of this disclosure is a method of tuning bulk acoustic wave filters on a single die. The method includes: providing a multi-filter die including a first plurality of bulk acoustic wave resonators of a first filter and a second plurality of bulk acoustic wave resonators of a second filter; and performing a shared trimming step that adjusts a resonant frequency of at least one of the first plurality of bulk acoustic wave resonators and a resonant frequency of at least one of the second plurality of bulk acoustic wave resonators.

The method can further include performing a second trimming step to adjust the resonant frequency of the at least one of the first plurality of bulk acoustic wave resonators without affecting the resonant frequencies of any of the second plurality of bulk acoustic wave resonators.

The method can further include performing a plurality of additional trimming steps to adjust the resonant frequencies of several of the first plurality of bulk acoustic wave resonators and several the second plurality of bulk acoustic wave resonators to a plurality of discrete target resonant frequencies. A total number of trimming steps performed can be less than the number of the plurality of target resonant frequencies. The total number of trimming steps performed can be at least three fewer than the number of the plurality of discrete target resonant frequencies.

The first plurality of bulk acoustic wave resonators and the second plurality of bulk acoustic wave resonators can be film bulk acoustic wave resonators. The first plurality of bulk acoustic wave resonators can include one or more bulk acoustic wave resonators having a respective raised frame structure.

The shared trimming step can adjusts the resonant frequency of the at least one of the first plurality of bulk acoustic wave resonators by trimming a portion of an upper electrode of the at least one of the first plurality of bulk acoustic wave resonators.

Another aspect of this disclosure is a method of tuning bulk acoustic wave filters on a single die. The method includes forming a first plurality of bulk acoustic wave resonators of a first filter on a die, each of the first plurality of bulk acoustic wave resonators having an associated resonant frequency; forming a second plurality of bulk acoustic wave resonators of a second filter on the same die as the first plurality of bulk acoustic wave resonators, each of the second plurality of bulk acoustic wave resonators having an associated resonant frequency; and performing a plurality of trimming steps to adjust at least some of the resonant frequencies of the first and second pluralities of bulk acoustic wave resonators, at least one of the plurality of trimming steps adjusting respective resonant frequencies of at least one of the first plurality of bulk acoustic wave resonators and at least one of the second plurality of bulk acoustic wave resonators.

Performing the plurality of trimming steps can include adjusting the resonant frequencies of the first plurality of bulk acoustic wave resonators to a first plurality of target resonant frequencies and adjusting the resonant frequencies of the second plurality of bulk acoustic wave resonators to a second plurality of target resonant frequencies. At least some of the first plurality of target resonant frequencies can be equal to at least some of the second plurality of target resonant frequencies. A frequency differential between two of the first plurality of target resonant frequencies can be equal to a frequency differential between two of the second plurality of target resonant frequencies. None of the first plurality of target resonant frequencies may be equal to at least one of the second plurality of target resonant frequencies.

Each of the first plurality of bulk acoustic wave resonators can include a piezoelectric layer, an upper electrode, and a lower electrode, the upper electrode and the lower electrode located on opposite sides of the piezoelectric layer. The first trimming step can adjusts the resonant frequency of the at least one of the first plurality of bulk acoustic wave resonators by trimming a portion of the upper electrode of the at least one of the first plurality of bulk acoustic wave resonators.

Another aspect of this disclosure is a method of forming a package including a multi-filter die. The method includes performing a shared trimming step on a first filter and a second filter of a multi-filter die, the first filter including a first plurality of bulk acoustic wave resonators and the second filter including a second plurality of bulk acoustic wave resonators, the shared trimming step adjusting a resonant frequency of at least one of the first plurality of bulk acoustic wave resonators of the first filter and adjusting an resonant frequency of at least one of the second bulk acoustic wave resonators of the second filter; forming at least one electrical connection between the multi-filter die and a package substrate supporting the multi-filter die; and encapsulating the multi-filter die in a package.

The method can further include performing a plurality of additional trimming steps to adjust the resonant frequencies of several of the first plurality of bulk acoustic wave resonators and several of the second plurality of bulk acoustic wave resonators to a first plurality of discrete target resonant frequencies of the first plurality of bulk acoustic wave resonators and a second plurality of discrete target resonant frequencies of the second plurality of bulk acoustic wave resonators. At least one of the discrete target resonant frequencies of the first plurality of bulk acoustic wave resonators can be equal to at least one of the discrete target resonant frequencies of the second plurality of bulk acoustic wave resonators.

The method can further include performing a plurality of additional trimming steps to adjust the resonant frequencies of a portion of the first plurality of bulk acoustic wave resonators and a portion of the second plurality of bulk acoustic wave resonators to a first plurality of discrete target resonant frequencies of the first plurality of bulk acoustic wave resonators and a second plurality of discrete target resonant frequencies of the second plurality of bulk acoustic wave resonators. A resonant frequency of at least one of the first plurality of bulk wave resonators may not be adjusted by a trimming step. A difference between a first discrete target resonant frequency and a second discrete target resonant frequency of the first plurality of discrete target resonant frequencies of the first plurality of bulk acoustic wave resonators is equal to a difference between a first discrete target resonant frequency and a second discrete target resonant frequency of the second plurality of discrete target resonant frequencies of the second plurality of bulk acoustic wave resonators. None of the first plurality of discrete target resonant frequencies of the first plurality of bulk acoustic wave resonators may be equal to one of the second plurality of discrete target resonant frequencies of the second plurality of bulk acoustic wave resonators.

Another aspect of this disclosure is a multi-filter package that includes a multi-filter die including a first filter and a second filter, a packaging substrate supporting the multi-filter die, and a packaging structure attached with the substrate. The first filter includes at least one bulk acoustic wave resonator. The packaging structure and the packaging substrate together form a package encapsulating the multi-filter die.

The second filter can include at least one bulk acoustic wave resonator. The one bulk acoustic wave resonators of the first filter and the one bulk acoustic wave resonator of the second filters can have respective resonant frequencies that are equal to each other. The one bulk acoustic wave resonators of the first filter and the one bulk acoustic wave resonator of the second filters can have be formed in a process that includes a shared trimming step. The bulk acoustic wave resonator of the first filter is can be electrical communication with the bulk acoustic wave resonator of the second filter by way of a conductive structure supported by the multi-filter die.

The first filter and the second filter can share a common input/output port.

The multi-filter package can further include first and second internal interconnect structures in electrical communication with the first filter and third and fourth internal interconnect structures in electrical communication with the second filter. The first and third internal interconnect structures can be in electrical communication with one another by way of a conductive structure internal to the package. The conductive structure internal to the package can be supported by the multi-filter die. The conductive structure internal to the package can be supported by the packaging substrate.

Another aspect of this disclosure is a package encapsulating multiple bulk acoustic wave filters. The package includes a packaging substrate; a first filter die supported by the packaging substrate and including a first bulk acoustic wave filter, the first bulk acoustic wave filter including at least one bulk acoustic wave resonator; a second filter die supported by the packaging substrate and including a second bulk acoustic wave filter, the second bulk acoustic wave filter including at least one bulk acoustic wave resonator; and a cover sealed to the packaging substrate and that together with the packaging substrate forms a package encapsulating the first and second filter dies.

The first bulk acoustic wave filter can have a different frequency range than the second bulk acoustic wave filter.

The first filter and the second filter can be formed using different material stacks.

Each of the at least one bulk acoustic wave resonator of the first bulk acoustic wave filter and the at least one bulk acoustic wave resonator of the second bulk acoustic wave filter can include a piezoelectric layer, an upper electrode, and a lower electrode, the upper electrode and the lower electrode located on opposite sides of the piezoelectric layer. A thickness of the piezoelectric layer of the at least one bulk acoustic wave resonator of the first bulk acoustic wave filter can be different from a thickness of the piezoelectric layer of the at least one bulk acoustic wave resonator of the second bulk acoustic wave filter. A thickness of the lower electrode of the at least one bulk acoustic wave resonator of the first bulk acoustic wave filter can be different from a thickness of the lower electrode of the at least one bulk acoustic wave resonator of the second bulk acoustic wave filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIGS. 7A through 7F illustrate cross-sections of a portion of two BAW resonators at various stages of a manufacturing process including a shared trimming step according to another embodiment.

FIGS. 9A through 9I illustrate cross-sections of a portion of three BAW resonators at various stages of a manufacturing process including two shared trimming steps according to another embodiment.

FIG. 11B is a top plan view schematically illustrating two BAW filters that are co-packaged and that each have a BAW resonators with the same resonant frequency.

FIG. 11C is a top plan view schematically illustrating two BAW filters that are co-packaged and that each have two BAW resonators with the same differential in resonant frequency.

DETAILED DESCRIPTION OF CERTAIN EMBODIMENTS

Figure 1:
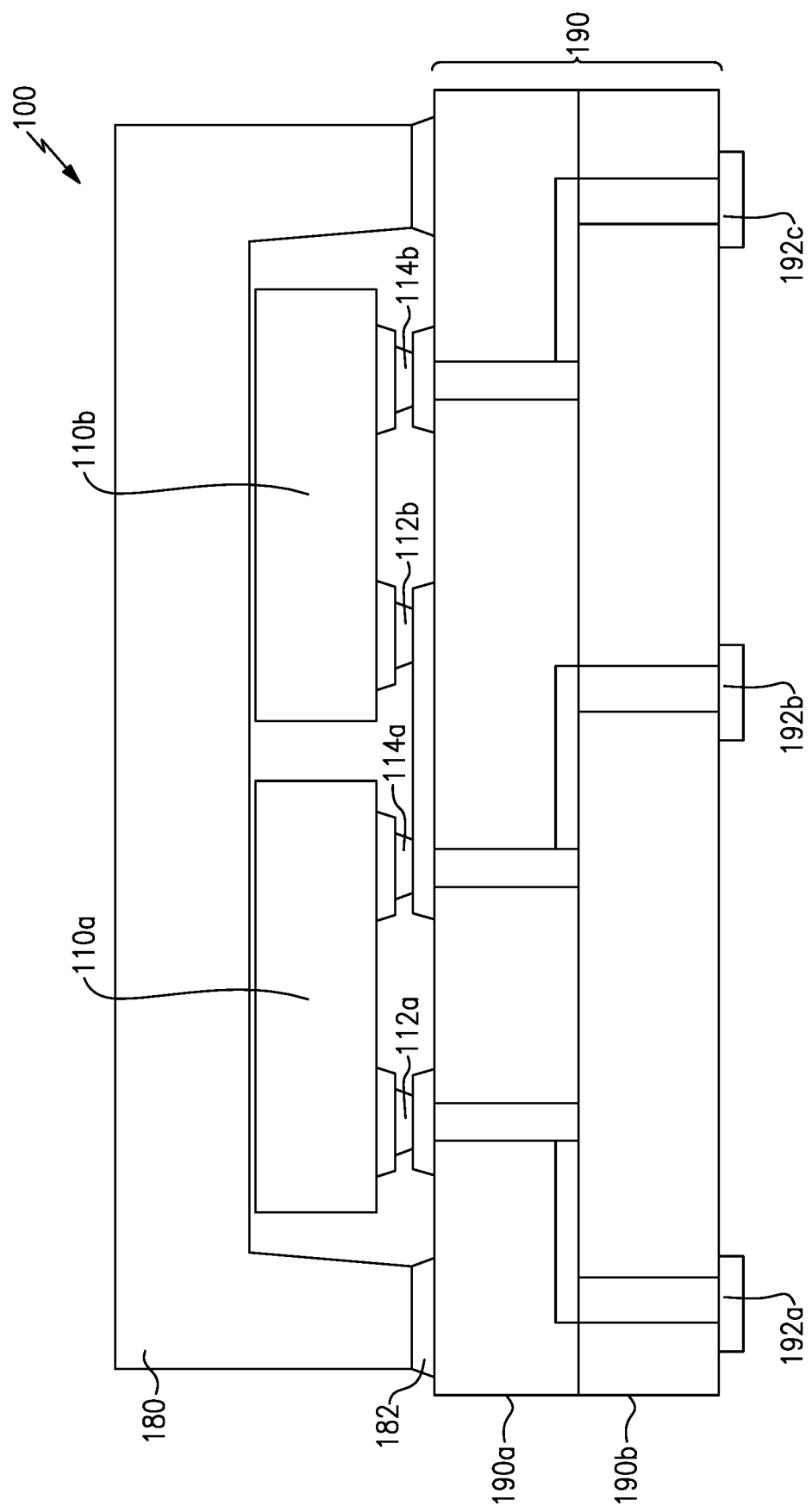
FIG. 1 is a cross sectional view illustrating a single package containing two bulk acoustic wave (BAW) filters on separate chips according to one embodiment.

The following description of certain embodiments presents various descriptions of specific embodiments. However, the innovations described herein can be embodied in a multitude of different ways, for example, as defined and covered by the claims. In this description, reference is made to the drawings, where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With reduced module sizes and specifications for better performance, it is becoming increasingly difficult to achieve desirable filter performance and be cost effective while reducing the size of filters. While a plurality of surface acoustic wave (SAW) filters can be included on a single die by virtue of the lithographic definition of the metal fingers of the interdigital electrodes, one bulk acoustic wave (BAW) filter is typically included on a single die, as the various material thicknesses of the layer stack of the BAW filter can largely determine the filter performance parameters.

Aspects of this disclosure relate to co-packaging two or more distinct BAW filters on a single die. The two or more BAW filters can be included in a multiplexer, such as a duplexer, or implemented as standalone filters. Multiple BAW filters on one die for a common frequency range can use the same stack and hence can be co-packaged on one die. Such BAW filters can meet different performance specifications. Multiple BAW filters having passbands that are relatively close together in frequency can use the same stack and be trimmed differently for co-packaged die. In some instances, BAW band pass filters having passbands that overlap can be implemented on a common die. While having the same stack can be advantageous for co-packaging, multiple stacks can alternatively or additionally be implemented. The same trimming masks can be used for multiple BAW resonators across different filters on the same die to achieve different frequencies for resonators. This can allow the designs to be more flexible and complex while also reducing mask costs.

In some instances, one or more BAW filters can be co-packaged with one or more other technologies on the same die. For example, one or more BAW filters can be co-packaged with one or more SAW filters and/or one or more filters that include Lamb wave resonators. As another example, two or more BAW filters can be co-packaged with one or more SAW filters and/or one or more filters that include Lamb wave resonators. Any suitable principles and advantages disclosed herein can be applied to filters that include two or more types of acoustic wave resonators (for example, a filter with at least one BAW resonator and at least one SAW resonator). Any suitable principles and advantages disclosed herein can be applied to filters that include acoustic wave resonators and inductor-capacitor components (for example, a filter with at least one BAW resonator, one or more inductors, and one or more capacitors).

Packaging more than one bulk acoustic wave (BAW) filter on the same die in a single package may allow for a reduction in the overall size of the packaging for those filters. Where multiple BAW filters are provided on a single die, and co-packaged together, the time and cost involved in fabricating the BAW filters can also be reduced through the use of shared processing steps. In particular, the BAW filters may be designed so that shared trimming steps between BAW resonators of the different filters on the single die can reduce the overall number of trimming steps involved in the fabrication of the BAW filters. This can also reduce a number of masks that are fabricated for manufacturing BAW filters. BAW filters may also be co-packaged with one or more acoustic wave filters of a different type.

FIG. 1 is a cross sectional view illustrating a single package containing two bulk acoustic wave (BAW) filters on separate chips according to one embodiment. The package 100 includes a cover 180 secured to a supporting structure including a packaging substrate 190 by a bond 182 extending around the periphery of the cover 180. The package 100 together with the components packaged therein can be referred to as a packaged component. The illustrated packaging substrate 190 is a multi-layer packaging substrate that includes first and second layers 190a and 190b, respectively. The cover 180 has a recessed portion in which a first die 110a and a second die 110b are located.

The first die 110a may include a first BAW filter, and the second die 110b may include a second BAW filter. In the illustrated embodiment, the cover 180 together with the supporting structure including packaging substrate 190 to encapsulate the first and second dies 110a and 110b that include the first and second BAW filters, respectively. Although described as including BAW filters, in some other embodiments, one or both of the dies 110a and 110b may include other acoustic wave filters, such as a SAW filter and/or Lamb wave resonator filter and/or a filter that includes two different types of acoustic wave devices, in place of or in addition to the BAW filter. One or more BAW filters enclosed by the package 100 can be electrically connected to one or more circuit elements that are external to the package 100 such as one or more other filters of a multiplexer, one or more passive circuit elements (such as one or more inductors and/or one or more capacitors), one or more radio frequency switches, one or more amplifiers (such as one or more power amplifiers or one or more low noise amplifiers), or any suitable combination thereof.

Connection with the first and second dies 110a and 110b in the interior of package 100 is provided by external interconnect structures 192a, 192b, and 192c extending through packaging substrate 190. As illustrated, these external interconnect structures may include vias extending through each of packaging substrate layers 190a and 190b. Some or all of the vias extending through the second packaging substrate layer 190b may be offset from a corresponding via extending through the first packaging substrate layer 190a to which it is connected, and a connected trace or other conductive structure located between the first packaging substrate layer 190a and the second packaging substrate layer 190b. The use of such offset vias allows the exposed external ends of the external interconnect structure to be spaced farther apart from one another than the internal connections and/or at desired locations, which may assist in the formation of electrical connections with the package 100.

Within the package 100, internal interconnect structures 112a and 114a provide electrical connections with first die 110a, These connections may represent, for example, an input and an output of the filter on first die 110a. Similarly, internal interconnect structures 112b and 114b provide electrical connections with second die 110b. These interconnect structures 112a, 112b, 114a, and 114b may be formed, for example, by soldering or otherwise connecting bond pads or other conductive structures on the interior surface of packaging substrate 190 to bond pads or other conductive structures on facing surfaces of first and second dies 110a and 110b.

In the illustrated embodiment, interconnect structure 112b is in electrical communication with interconnect structure 114a, via a conductive trace or other structure on the interior surface of packaging substrate 190. This connection may provide an electrical connection, internal to the package 100, between the filter on the first die 110a and the second die 110b. In some other embodiments, an internal connection may be provided using a conductive structure located between first packaging substrate layer 190a and second packaging substrate layer 190b. In some other embodiments, a package may have no internal connection between the dies 110a and 110b, and any desired connection may be formed through external connections, which may be formed or otherwise provided after the package 100 is sealed.

Figure 2A:
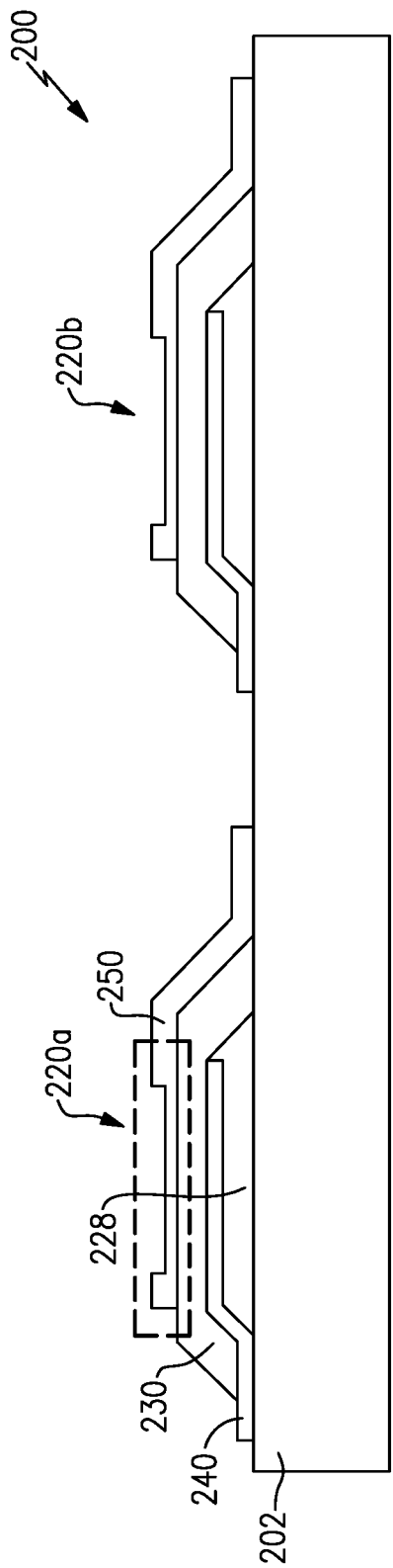
FIG. 2A is a cross sectional view illustrating a single substrate supporting two BAW resonators according to an embodiment.
Figure 2B:
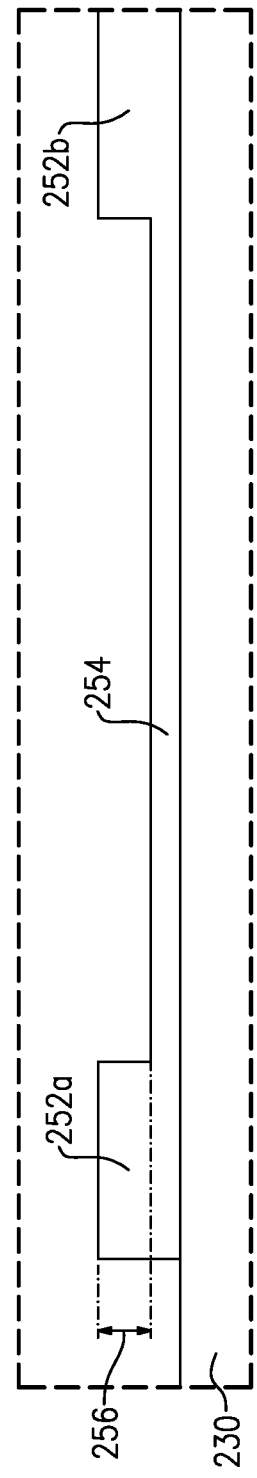
FIG. 2B is a cross sectional view of a portion of one of the BAW resonators of FIG. 2A.

In some embodiments, rather than packaging two or more individual dies, each supporting a single BAW filter or another filter, a multi-filter die may be provided and packaged. FIG. 2A is a cross sectional view illustrating a single substrate supporting two BAW resonators according to an embodiment. FIG. 2B is a zoomed in cross sectional view of a portion of one of the BAW resonators of FIG. 2A. In the illustrated embodiment, the BAW resonators 220a and 220b are formed on a single substrate 202, which may be a silicon substrate or a support substrate of any other suitable material. The BAW resonators 220a and 220b can be included in different filters. Accordingly, FIG. 2A illustrates BAW resonators of different filters on a common die. Additional resonators may also be provided on the substrate, although such additional resonators are not depicted in FIG. 2A.

In the filter assembly 200 illustrated in FIG. 2A, the BAW resonators 220a and 220b are similar in structure and design to one another. With sufficient similarity between the BAW resonators 220a and 220b, the same material stack may be used to form the BAW resonators 220a and 220b, increasing the efficiency of the fabrication process by allowing simultaneous fabrication of multiple resonators. In some other embodiments, however, the BAW resonators 220a and 220b may be formed using manufacturing processes which differ from one another with respect to at least one step or material, such that only a portion of the fabrication steps and/or materials may be shared between the BAW resonators 220a and 220b. In some other embodiments, the fabrication processes for the first and second BAW resonators 220a and 220b may be entirely distinct from one another.

As illustrated, the BAW resonators 220a and 220b are film bulk acoustic wave resonators (FBARs), and are partially spaced apart from the underlying substrate 202 by an air gap or cavity 228. This cavity 228 may be formed, for example, by depositing or otherwise forming a sacrificial layer or layers in a desired shape prior to the formation of overlying layers of the BAW resonators 220a and 220b, and subsequently removing the sacrificial layer or layers at a later stage of the fabrication process. Alternatively, an air cavity can be etched into the substrate 202 in certain instances (not illustrated in FIG. 2A). In some other embodiments, the BAW resonators may be solidly mounted resonators without such a cavity 228. In such embodiments, the BAW resonators may instead include an acoustic Bragg reflector. Such an acoustic Bragg reflector may be used in place of or in addition to one or more cavities, depending on the design of the particular BAW resonator. The embodiments described herein may be suitable for use with BAW resonators of any suitable type or design, and any suitable combination of such resonators.

The BAW resonators 220a and 220b include a lower electrode 240 and an upper electrode 250, separated from one another by a piezoelectric layer 230. The piezoelectric layer 230 can be an aluminum nitride (AlN) layer or any other suitable piezoelectric layer. Portions of the piezoelectric layer 230 and the lower and upper electrodes 240 and 250 extend over the cavity 228. At least a portion of the upper electrode 250 can be patterned to adjust the resonant frequency of the BAW resonators 220a and 220b. An active region or active domain of a bulk acoustic wave resonator can be defined by the portion of the piezoelectric layer 230 that overlaps and is in contact with both the upper electrode 250 and the second electrode 240 over the cavity 228. In the embodiment shown in FIGS. 2A and 2B, the lower and upper electrodes 240 and 250, respectively, overlap for a significant portion of the illustrated piezoelectric layer 230. The portions of these layers within the active region of the BAW resonators 220a and 220b may be substantially parallel to the underlying surface of the substrate 202.

Additional layers not explicitly illustrated in FIGS. 2A and 2B may also be included, such as passivation layers. A passivation layer may be provided, for example, between the sacrificial layer and the other layers of the BAW resonator to protect those layers from the fabrication steps used in the removal of the sacrificial layer. Such a passivation layer can be present in a bulk acoustic wave device after removal of the sacrificial material. Similarly, a passivation layer may be provided over the upper surfaces of the layers of the BAW resonator.

As can be seen in the detail view of FIG. 2B, a portion of the upper electrode 250 overlying the piezoelectric layer 230 includes a thinner central section 254 surrounded by a raised frame structure including a first raised frame section 252a and a second raised frame section 252b. Although described as two raised frame sections 252a and 252b in the context of the cross-sectional view of FIGS. 2A and 2B, the raised frame may extend in a contiguous manner around the periphery of the central section 254. Such a raised frame can have an annular shape in plan view. The portion of the BAW resonator including the raised frame structure may be referred to as the raised frame zone or as a border ring. The thinner central section 254 may be recessed by a distance 256. The raised frame structure can block lateral energy leakage from the active area of the BAW resonators 220a or 220b. In some embodiments, a BAW resonator may include two or more raised frame zones. Alternatively or additionally, a BAW resonator can include one or more recessed frame zones in which an upper electrode is thinner than in the active region of the BAW resonator.

The BAW resonators 220a and 220b may be electrically connected to one another, or to other resonators supported by the substrate 202, by way of any suitable conductive structure. In some embodiments, connections between resonators may include interconnect traces or other structures formed on the same side of the substrate 202 as the resonators. In some embodiments, connections between resonators, or to external components, may include conductive vias extending into or through the substrate 202.

The BAW resonator 220a may form a part of a first filter supported by substrate 202, and the BAW resonator 220b may form a part of a second filter supported by substrate 202. Suitable interconnections between the filters on substrate 202, if desired, may also be formed by any suitable conductive structure. The BAW resonators 220a and 220b can be included in different filters and have the same resonant frequency.

Figure 3A:
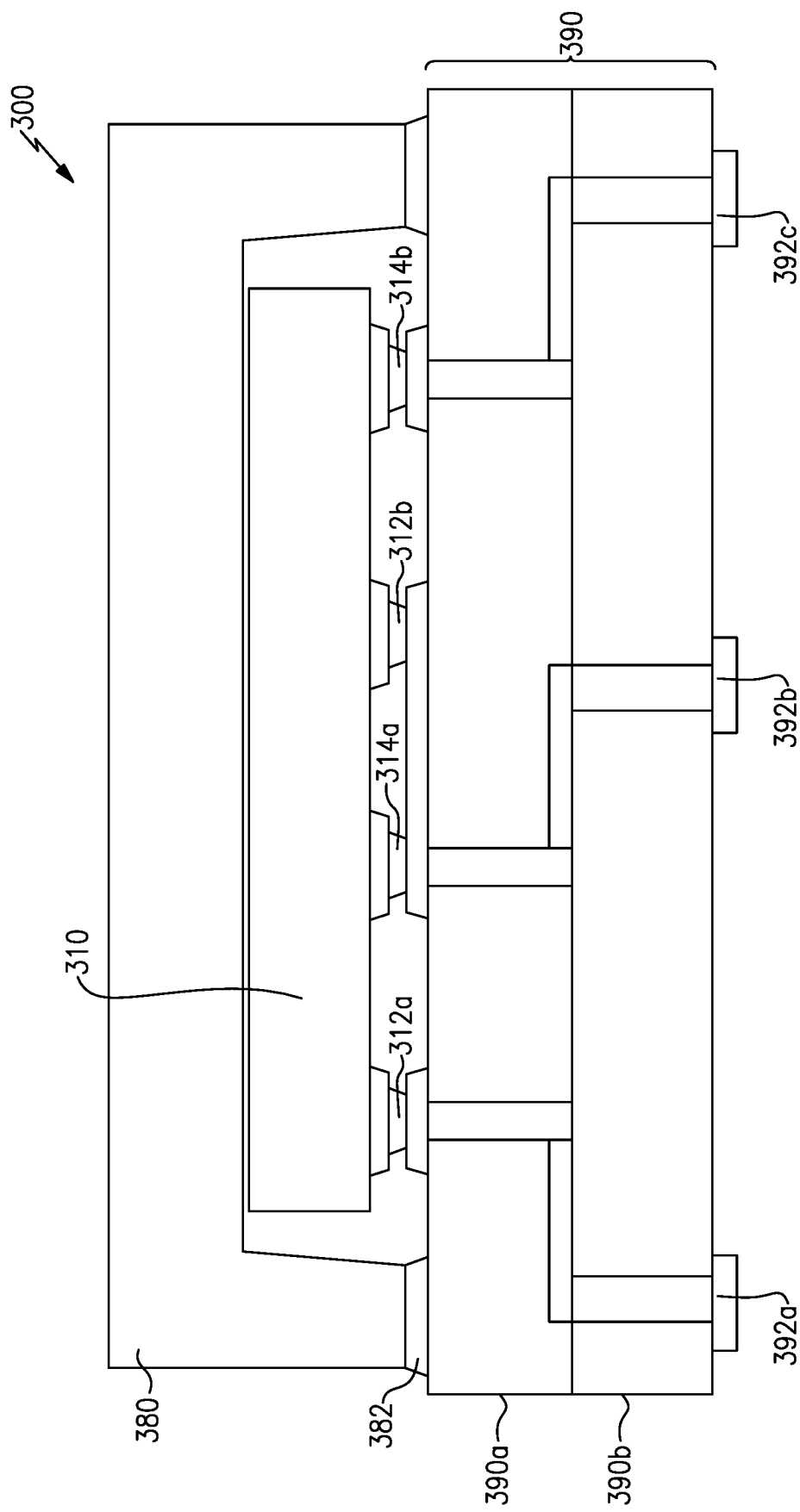
FIG. 3A is a cross sectional view illustrating a single package containing two bulk acoustic wave (BAW) filters on a single chip according to an embodiment.

FIG. 3A is a cross sectional view illustrating a single package containing two bulk acoustic wave (BAW) filters on a single chip according to an embodiment. The package 300 includes a cover 380 secured to a packaging substrate 390 including packaging substrate layers 390a and 390b by a bond 382 extending around the periphery of the cover 380. The cover 380 has a recessed portion in which a multi-filter die 310 is located. The multi-filter die 310 includes a first BAW filter and a second BAW filter. Cover 380 together with the supporting structure 390 including packaging substrate layers 390a and 390b encapsulates the multi-filter die 310, which includes the first and second BAW filters. Although described as including BAW filters, in some other embodiments one or more of the filters of the multi-filter die 310 may be an acoustic wave filter of another type, such as a SAW filter. Alternatively or additionally, one or more filters of the multi-filter die 310 can include two types of acoustic wave resonators, such as a BAW resonator and a SAW resonator. Moreover, although some description is with reference to two BAW filters for illustrative purposes, any suitable principles and advantages disclosed herein can be applied to applications with three or more BAW filters.

External interconnect structures 392a, 392b, and 392c extending through packaging substrate layers 390a and 390b provide electrical connections with the filters of the multi-filter die 310 in the interior of package 300. Within the package 300, internal interconnect structures 312a, 312b, 314a, and 314b provide electrical connections with the multi-filter die 310. These connections may represent input/outputs of the filters on multi-filter die 310.

In the illustrated embodiment, internal interconnect structure 312b is in electrical communication with internal interconnect structure 314a, via a conductive trace or other structure on the interior surface of packaging substrate layer 390a. This connection may provide an electrical connection, internal to the package 300, between two filters on multi-filter die 310. In some other embodiments, an internal connection may be provided on or in the multi-filter die 310 itself. In such instances, the multi-filter die 310 can include a common input/output contact shared by the two BAW filters. Such an embodiment is described with respect to FIG. 3C.

Figure 3B:
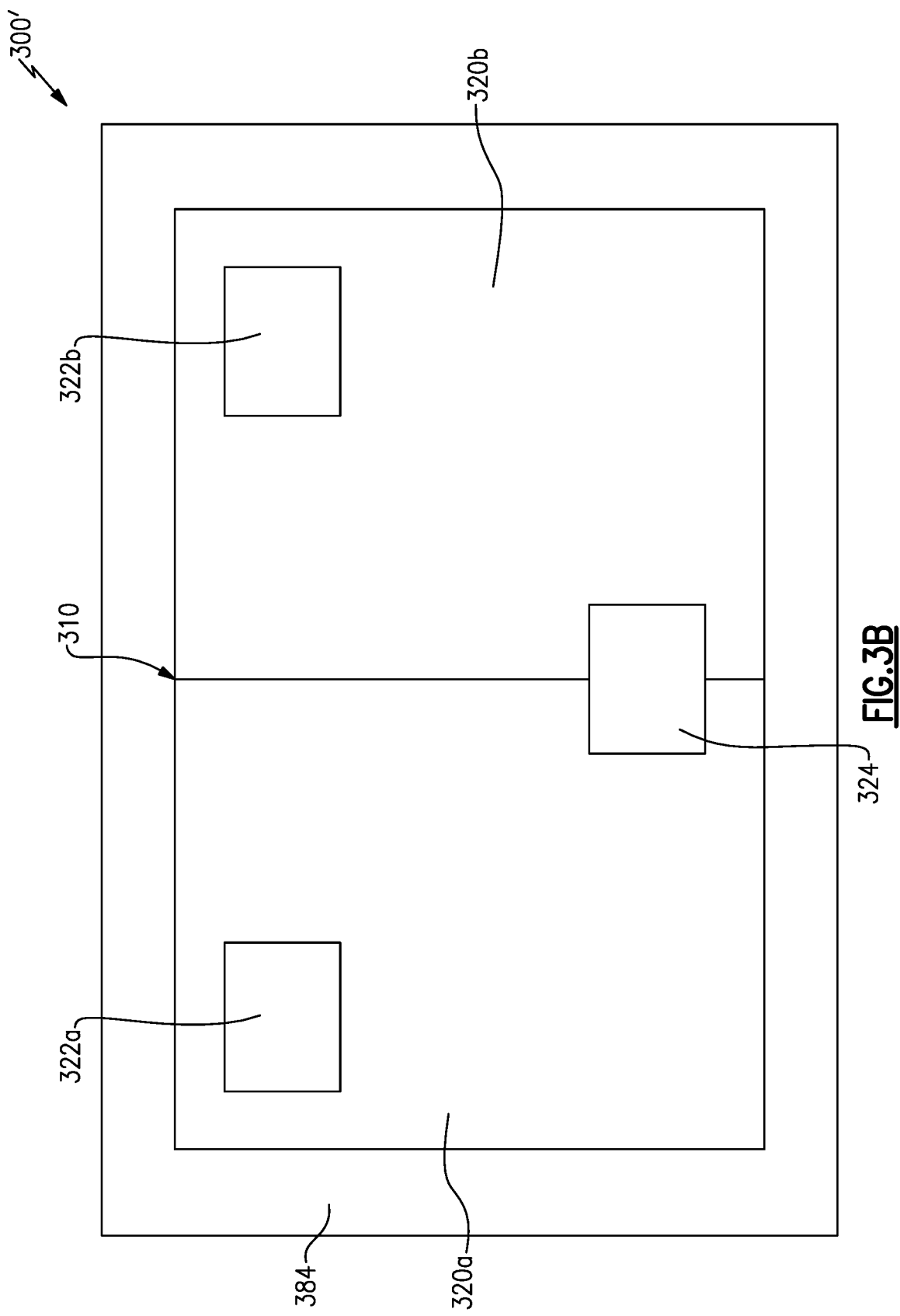
FIG. 3B is a top plan view schematically illustrating two co-packaged BAW filters having a shared input/output according to another embodiment.

FIG. 3B is a top plan view schematically illustrating two co-packaged BAW filters having a shared input/output contact according to another embodiment. Because the BAW filters 320a and 320b are co-packaged within a single package 300', the packaging area 384 surrounding the BAW filters 320a and 320b need not extend between the two filters 320a and 320b, which should reduce the overall size of the package 300' in comparison to separately packaging filters 320a and 320b.

The first BAW filter 320a on the shared multi-filter die 310 has a discrete input/output 322a, and the second BAW filter 320b on the shared multi-filter die 310 has a discrete input/output 322b. A shared input/output 324 is also provided. In some embodiments, the shared input/output 324 may be a shared output, and the filters may have discrete inputs 322a and 322b. In some embodiments and/or modes, the shared input or output 324 may be a shared output, and the filters may have discrete inputs 322a and 322b. In some embodiments and/or modes, the shared input/output 324 may serve as an input to one filter, and an output to the other filter. The shared input/output 324 can be an input for one mode (e.g., receiving) and an output for another mode (e.g., transmitting).

Figure 3C:
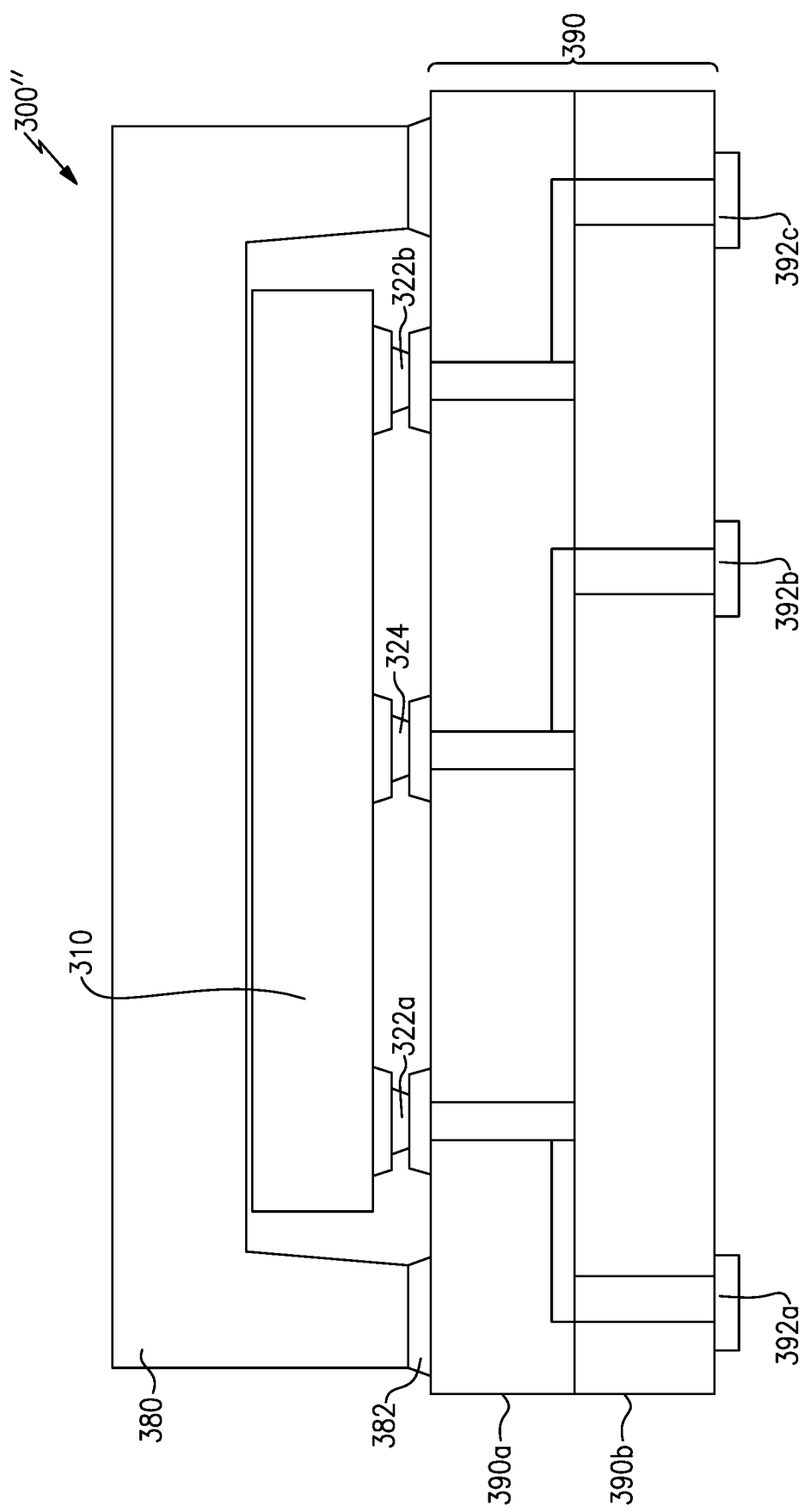
FIG. 3C is a cross sectional view of single package containing two bulk acoustic wave (BAW) filters on a single chip with a shared input/output on the chip according to another embodiment.

FIG. 3C is a cross sectional view of single package containing two bulk acoustic wave (BAW) filters on a single chip with a shared input/output on the chip. Instead of the four internal structures of FIG. 3A, the illustrated package 300" of FIG. 3C includes only three internal interconnect structures, corresponding to a shared input/output 324 and discrete input/outputs 322a and 322b of the multi-filter die 310. The two BAW filters of the package 300" can be included in a duplexer. The shared input/output can be a common node of the duplexer. The principles and advantages of the embodiment of FIG. 3C for a duplexer can be applied to other multiplexers, such as a quadplexer, a hexaplexer, etc.

Figure 4A:
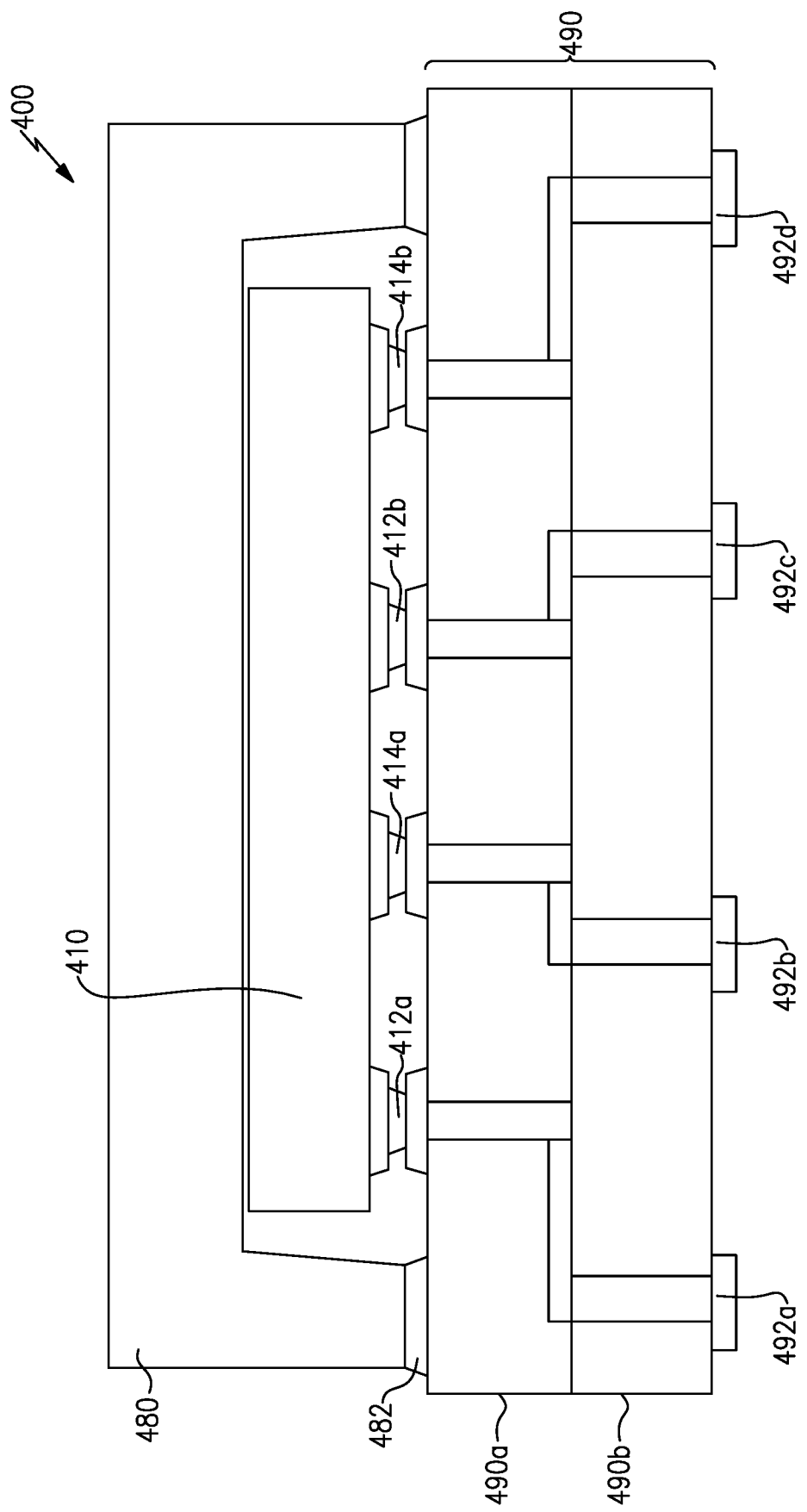
FIG. 4A is a cross sectional view illustrating a single package containing two bulk acoustic wave (BAW) filters on a single chip according to another embodiment.

FIG. 4A is a cross sectional view illustrating a single package containing two bulk acoustic wave (BAW) filters on a single chip according to another embodiment. The illustrated package 400 includes a cover 480 secured to a supporting structure 490 including packaging substrates 490a and 490b by a bond 482 extending around the periphery of the cover 480. The cover 480 has a recessed portion in which a multi-filter die 410 is located. The multi-filter die 410 includes a first BAW filter and a second BAW filter. In contrast to the filters of the packages in FIG. 3A and FIG. 3C, in which the filters on the multi-filter die are electrically connected to one another by a connection internal to the package or internal to the multi-filter die itself, the filters on the multi-filter die 410 are shown as not being electrically connected to one another within the packaged 400. Cover 480 together with the supporting structure of a package substrate 490 including packaging substrate layers 490a and 490b encapsulates the first and multi-filter die 410, which includes the first and second BAW filters. Although described as including BAW filters, in some other embodiments one or more of the filters of the multi-filter die 410 may be an acoustic wave filter of another type, such as a SAW filter. Alternatively or additionally, one or more filters of the multi-filter die 410 can include two types of acoustic wave resonators, such as a BAW resonator and a SAW resonator. In some embodiments, two co-packaged filters, including two co-packaged filters on the multi-filter die 410, may be filters which are not used at the same time. For example, if the two filters are part of different multiplexers, there may be periods of time during which one multiplexer is being used, and the other is not, such that only one of the two filters is being used at a given time.

External interconnect structures 492a, 492b, 492c, and 492d extending through packaging substrate layers 490a and 490b provide electrical connections with the filters of the multi-filter die 410 in the interior of package 400. Within the package 400, internal interconnect structures 412a, 412b, 414a, and 414b provide electrical connections with the multi-filter die 410. These connections may represent input/outputs of the filters on multi-filter die 410. In the illustrated embodiment, each of the internal interconnect structures 412a, 412b, 414a, and 414b provide discrete electrical connections with respective external interconnect structures 492a, 492b, 492c, and 492d.

Figure 4B:
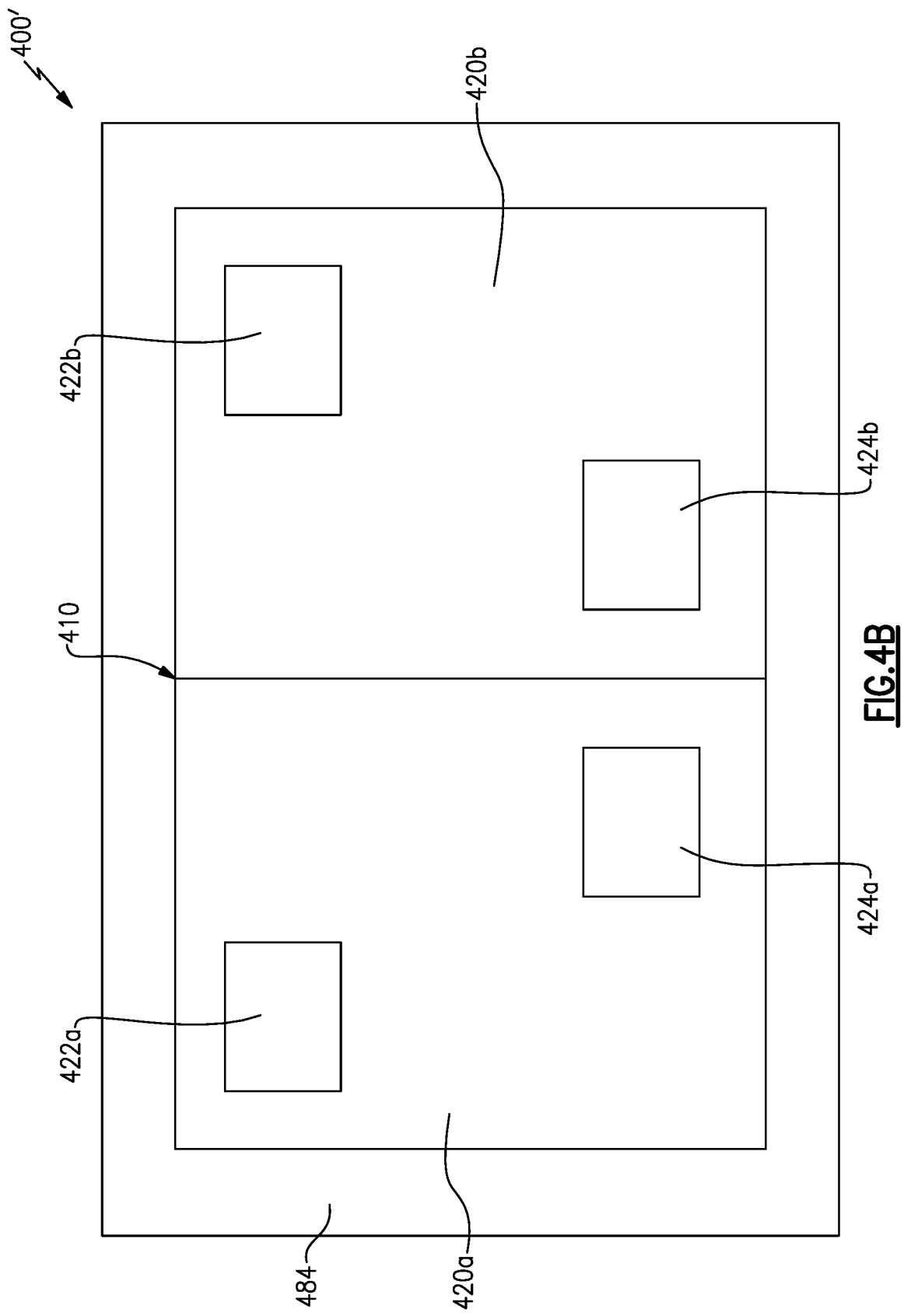
FIG. 4B is a top plan view schematically illustrating two co-packaged BAW filters having distinct inputs and outputs according to another embodiment.

FIG. 4B is a top plan view schematically illustrating two co-packaged BAW filters 420a and 420b having distinct input/outputs according to another embodiment. The first BAW filter 420a on the shared multi-filter die 410 has a first discrete input/output 422a and a second discrete input/output 424a, and the second BAW filter 420b on the shared multi-filter die 410 has a first discrete input/output 422b and a second discrete input/output 424b. Packaging area 484 is included around the BAW filters 420a and 420b along a perimeter of the shared multi-filter die 410. Because the BAW filters 420a and 420b are co-packaged within a single package 400', the packaging area 484 surrounding the BAW filters 420a and 420b need not extend between the two filters 420a and 420b. This can reduce the overall size of the package 400' in comparison to separately packaging filters 420a and 420b.

Figure 4C:
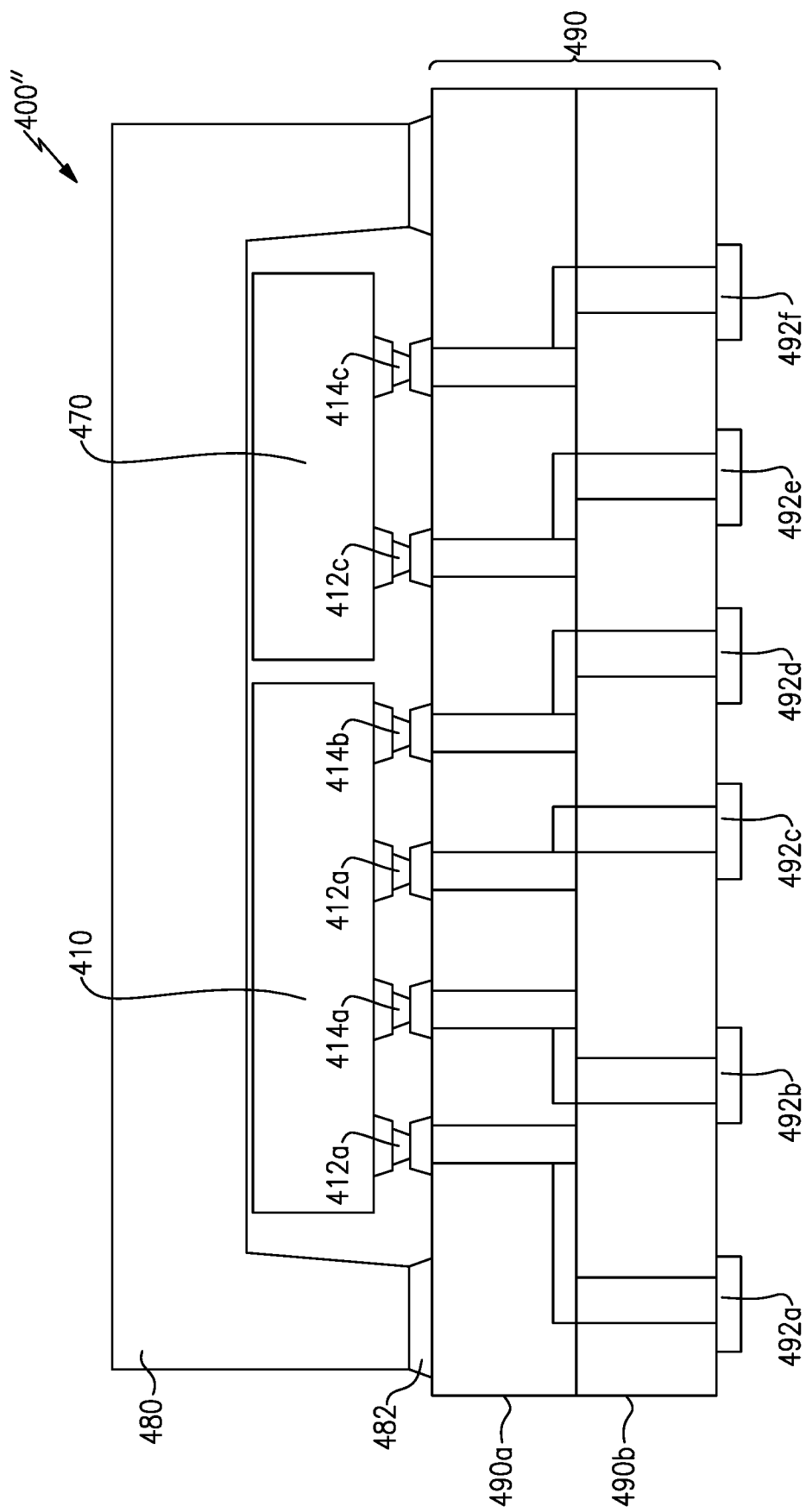
FIG. 4C is a cross sectional view illustrating a single package containing two bulk acoustic wave (BAW) filters on a single chip and an additional filter on a second chip according to another embodiment.

Additional dies can be included on the same substrate as a multi-filter die. FIG. 4C is a cross sectional view illustrating a single package 400" containing two bulk acoustic wave (BAW) filters on a single chip and an additional filter on a second chip. In addition to the multi-filter die 410, which includes at least first and second BAW filters, an additional filter die 470, having associated internal interconnects 412c and 414c connected to external interconnects 492e and 492f. The multi-filter die 410 can include any suitable combination of features of the multi-filter die 410 of FIG. 4A and/or FIG. 4B. In some embodiments, the additional filter die 470 may include at least one filter of another type, such as a surface acoustic wave (SAW) filter or a Lamb wave filter. In other embodiments, the additional filter 470 die may include an additional BAW filter, which may be of a design different in materials or design from the BAW filters of the multi-filter die 410.

Figure 5:
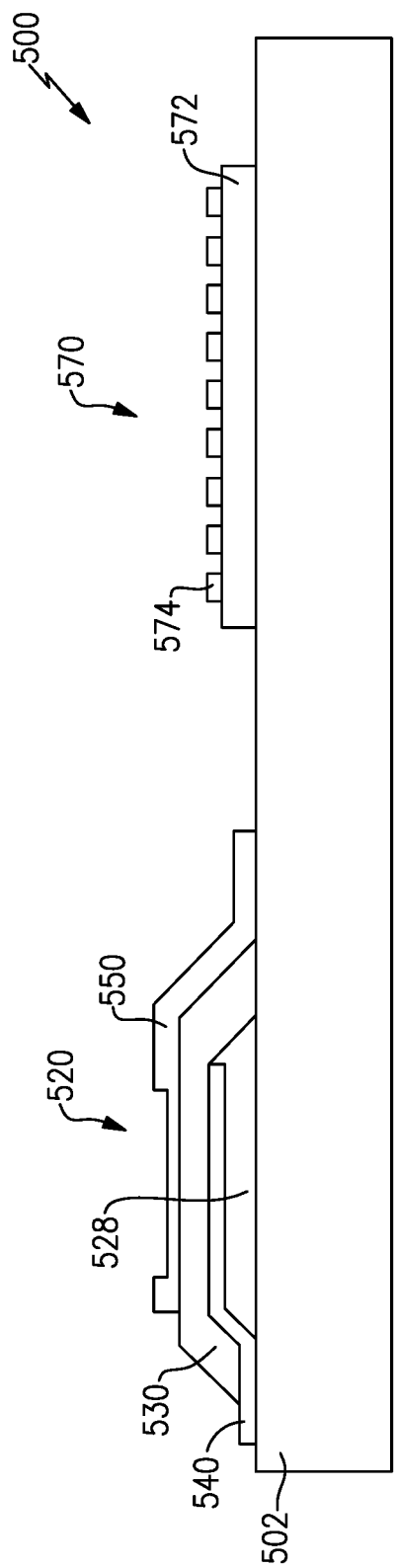
FIG. 5 is a cross sectional view illustrating a single substrate supporting a BAW resonator and a surface acoustic wave (SAW) resonator according to another embodiment.

In some embodiments, a BAW resonator may be provided on a single die together with an acoustic resonator of another type. FIG. 5 is a cross sectional view illustrating a single substrate supporting a BAW resonator and a surface acoustic wave (SAW) resonator according to another embodiment. The BAW resonator and the SAW resonator can be included on a shared die. The shared die can be implemented in accordance with any suitable principles and advantages disclosed herein. For example, the shared die can include BAW resonators of two different filters and an SAW resonator. The SAW resonator can be included in a third filter in certain instances. Alternatively, the SAW resonator can be included in one of the two different filters that include BAW resonators.

In the illustrated filter assembly 500 of FIG. 5, a BAW resonator 520 is supported by a substrate 502, along with a SAW resonator 570. The BAW resonator 510 includes an upper electrode 550 and a lower electrode 540, spaced apart from one another by a piezoelectric layer 530. A portion of the upper electrode 550, lower electrode 540, and piezoelectric layer 530 are spaced apart from the substrate 502 by a cavity 528.

At another location of the substrate 502, a SAW resonator 570 is supported. The SAW resonator 570 may include a piezoelectric layer 572 supported by the substrate 502. On the opposite side of the piezoelectric layer 572 from the substrate 502 is an interdigital transducer electrode 574. The SAW resonator 570 may also include additional layers not explicitly depicted in FIG. 5. For example, the interdigital transducer electrode 574 may be a multilayer structure, including at least two different conductive materials in a stack. The SAW resonator 570 may be a temperature-compensated SAW resonator, and may include a temperature compensation layer located over the interdigital transducer electrode 574, such as a silicon dioxide ($SiO_2$) layer. In some other instances, the SAW resonator 570 can be a multi-layer piezoelectric substrate SAW resonator including one or more additional layers positioned between the substrate 502 and the piezoelectric layer 570.

In some embodiments, at least some of the layers of the SAW resonator 570 may include materials which are common to the BAW resonator 520. For example, the piezoelectric layer 530 of the BAW resonator 520 may include the same material as the piezoelectric layer 572 of the SAW resonator 570. Similarly, the upper electrode 550 or the lower electrode 540 of the BAW resonator 520 may include the same material as the interdigital transducer electrode 574 of the SAW resonator 570.

In some embodiments, the BAW resonator 520 may form a part of a first filter, and the SAW resonator 570 may form a part of a second filter supported by the same substrate 502 as the first filter. In some embodiments, the BAW resonator 520 may form a part of the same filter as the SAW resonator 570. In some further embodiments, a second filter including other acoustic wave resonators may be formed on the same substrate. In addition, although not explicitly illustrated in FIG. 5, interconnect electrodes that provide electrical communication with other resonators on the substrate 502 to form filter structures may also be provided.

In some other embodiments, other types of acoustic wave resonators may be supported by the substrate 502, in addition to or in place of SAW resonator 570. In some embodiments, the substrate 502 may support both a BAW resonator and a Lamb wave resonator.

In contrast to the wafer of FIG. 2A, in which the illustrated BAW resonators are similar in structure and design, wafers may also be provided which support BAW resonators which are distinct in structure and/or design from one another. Despite these differences, manufacturing efficiencies may be realized in forming multiple BAW resonators on a common substrate, even when the final designs of those BAW resonators are different from one another.

Figure 6:
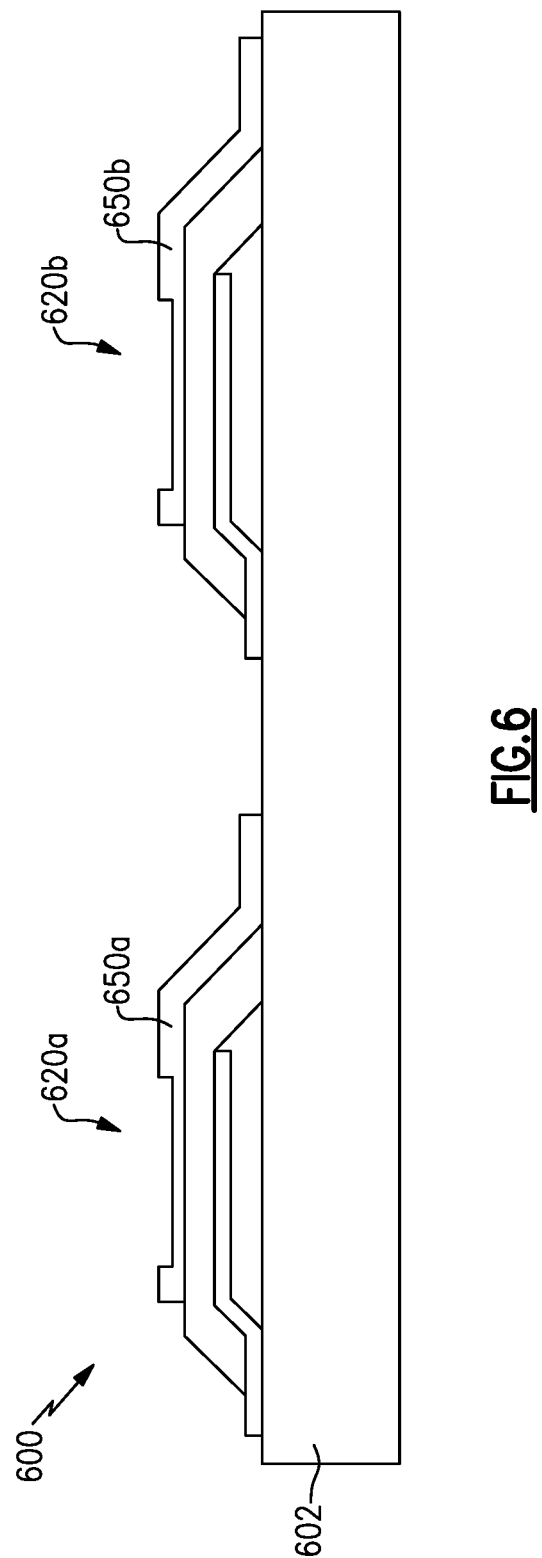
FIG. 6 is a cross sectional view illustrating a single substrate supporting two BAW resonators having different resonant frequencies according to another embodiment.

FIG. 6 is a cross sectional view illustrating a single substrate 602 supporting two BAW resonators 620a and 620b having different resonant frequencies according to another embodiment. The BAW resonators 620a and 620b can be included in different respective filters and implemented on a single die. Other BAW resonators and/or other types of acoustic wave resonators can be implemented on the single die. In the illustrated filter assembly 600, the first BAW resonator 620a is similar in structure and design to the second BAW resonator 620b, except for the profile of the upper electrode 650a of first BAW resonator 620a and upper electrode 650b of second BAW resonator 620b. The thickness of the upper electrode 650a of first BAW resonator 620a in a central region is thinner than the thickness of the upper electrode 650b of second BAW resonator 620b in a central region. This difference in thickness of portions of the upper electrodes 650a and 650b can affect the resonant frequency of the first and second BAW resonators 620a and 620b, respectively.

Although the other components of the first and second BAW resonators 620a and 620b in the illustrated are similar in structure and design to one another, in other embodiments, there may be additional distinctions in the structure or design of the BAW resonators. For example, in some embodiments, certain layers of the first and second BAW resonators 620a and 620b may differ in composition or thickness from one another, or additional layers or components may be included in one of the first and second BAW resonators 620a and 620b and not included in the other. Even in such embodiments, common processing steps and/or materials between the first and second BAW resonators 620a and 620b may make fabrication of both resonators on a single substrate more efficient than fabricating those resonators on separate substrates.

In an embodiment in which two or more BAW filters having different layer stacks are formed on a substrate, the layer stacks may include unique layers which differ from a corresponding layer in the other layer stack. These unique layers may differ from one another with respect to the thickness of at least one unique layer, and/or with respect to the composition of at least one unique layer. In some embodiments, the two or more BAW filters may be formed in entirely separate fabrication processes, while in other embodiments, at least some fabrication steps may be common between more than one BAW filter on the substrate.

In some particular embodiments, two or more BAW filters formed on a substrate may each include at least one unique layer having a property not shared with a layer of another BAW filter, but other layers of the layer stacks of the BAW filters may be common to each BAW filter. In such an embodiment, at least some the shared layers may be formed in common fabrication steps, while the unique layers may be formed in separate steps for each BAW filter, or using at least one unique fabrication step.

In an embodiment where one of the unique layers of one BAW filter differs from one of the unique layers of a different BAW filter only in thickness, but includes the same material, a shared fabrication step may be used between filters, while a further unique fabrication step may be applied only to one of the filters. For example, in some embodiments, a given layer of a first BAW filter layer stack is thicker than a corresponding layer of a second BAW filter layer stack. In one specific embodiment, layers of thickness equal to the thinner of the two layers may be formed in both layer stacks, and an additional layer of a thickness equal to the difference between the thickness of the thicker layer and the thickness of the thinner layer may be formed only in the first BAW filter layer stack. In another embodiment, layers of thickness equal to the thicker of two layers may be formed in both layer stacks, and that layer of the second BAW filter layer stack may be trimmed or otherwise reduced in thickness until a sufficiently thin layer is formed.

In an embodiment in which BAW resonators formed on a single substrate differ from one another at least in the design of their upper electrodes, common trimming steps may be used to reduce the number of trimming steps required to form such resonators. This efficiency increase may be more pronounced in an embodiment in which multiple filters are formed on a single substrate, as the use of common trimming steps across resonators of multiple filters can reduce the total number of processing steps used to form a multi-filter structure.

Figure 7E:
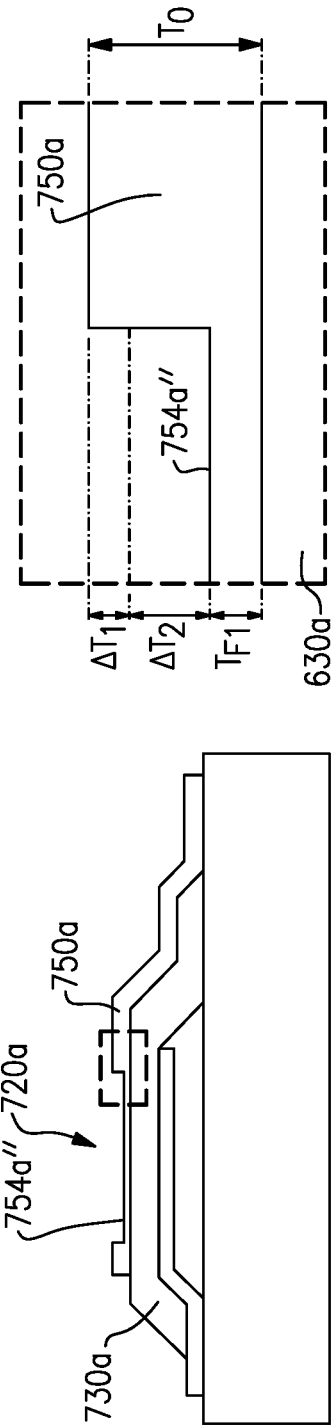

FIGS. 7A through 7F illustrate cross-sections of a portion of two BAW resonators at various stages of a manufacturing process including a shared trimming step according to another embodiment. These BAW resonators can be included in different filters on the same multi-filter die. FIG. 7A is a cross-section of a first BAW resonator 720a including an upper electrode 750a overlying a portion of a piezoelectric layer 730a. Also shown in FIG. 7A is a zoomed in view of a portion of the upper electrode 750a. FIG. 7B is a cross-section of a second BAW resonator 720b supported by the same substrate as the substrate supporting the first BAW resonator 720a. The second BAW resonator includes an upper electrode 750b overlying a portion of a piezoelectric layer 730b. FIG. 7B also includes a zoomed in view of a portion of the upper electrode 750a. FIGS. 7A and 7B illustrate that that the upper electrodes 750a and 750b are formed with an initial thickness $T_0$.

FIGS. 7C and 7D are cross-sections of the BAW resonators 720a and 720b, respectively, after a first trimming step. FIG. 7C shows that the first trimming step has reduced the thickness of a central region 754a' of the upper electrode 750a of the first BAW resonator 720a, while leaving the thickness of a frame region of the upper electrode 750a surrounding the central region 754a' at the initial thickness $T_0$. This trimming step reduces the resonant frequency of the first BAW resonator 720a. In particular, the first trimming step has reduced the thickness of the central region 754a' of the upper electrode 750a of the first BAW resonator 720a by a thickness of $\Delta T_1$. This first trimming step, however, has not been applied to the upper electrode 750b of the second BAW resonator 720b, which remains at the initial thickness $T_0$.

Figure 7F:
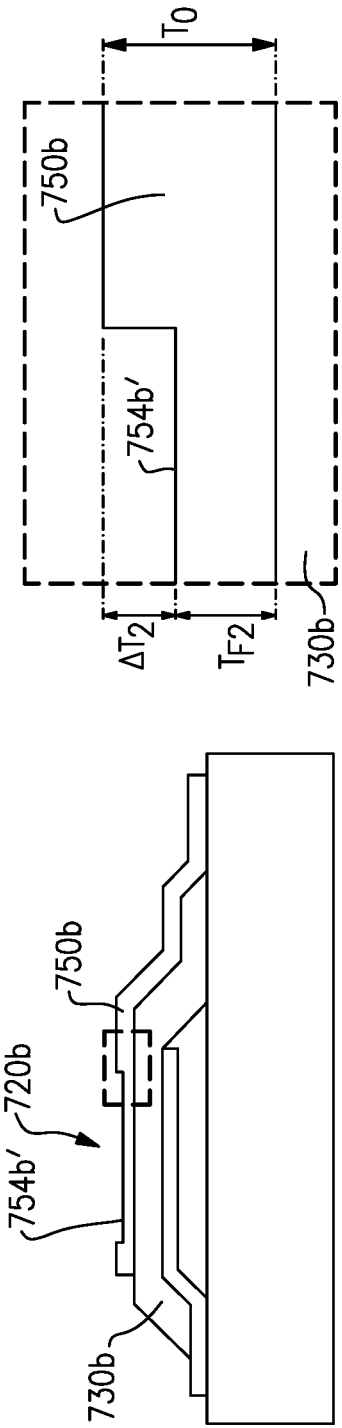

FIGS. 7E and 7F are cross-sections of the BAW resonators 720a and 720b, respectively, after a second trimming step. In contrast to the first trimming step, which was applied only to the first BAW resonator 720a, the second trimming step is applied to both of the BAW resonators 720a and 720b. The zoomed in view of FIG. 7F shows that the second trimming step has reduced the thickness of the central region 754b' of the upper electrode 750b of the second BAW resonator 720b by a thickness of $\Delta T_2$. This reduces the thickness of the central region 754b' of the upper electrode 750b of the second BAW resonator 720b to a final thickness of $T_{F2}$.

The zoomed in view of FIG. 7E shows that the second trimming step has reduced the thickness of the central region 754a'' of the upper electrode 750a of the first BAW resonator 720a by an additional thickness of $\Delta T_2$. This reduces the thickness of the central region 754a'' of the upper electrode 750a of the second BAW resonator 720a to a final thickness of $T_{F1}$, where $T_{F1}$ differs from the initial thickness $T_0$ of the upper electrode 750a by the sum of $\Delta T_1$ and $\Delta T_2$.

Figure 8:
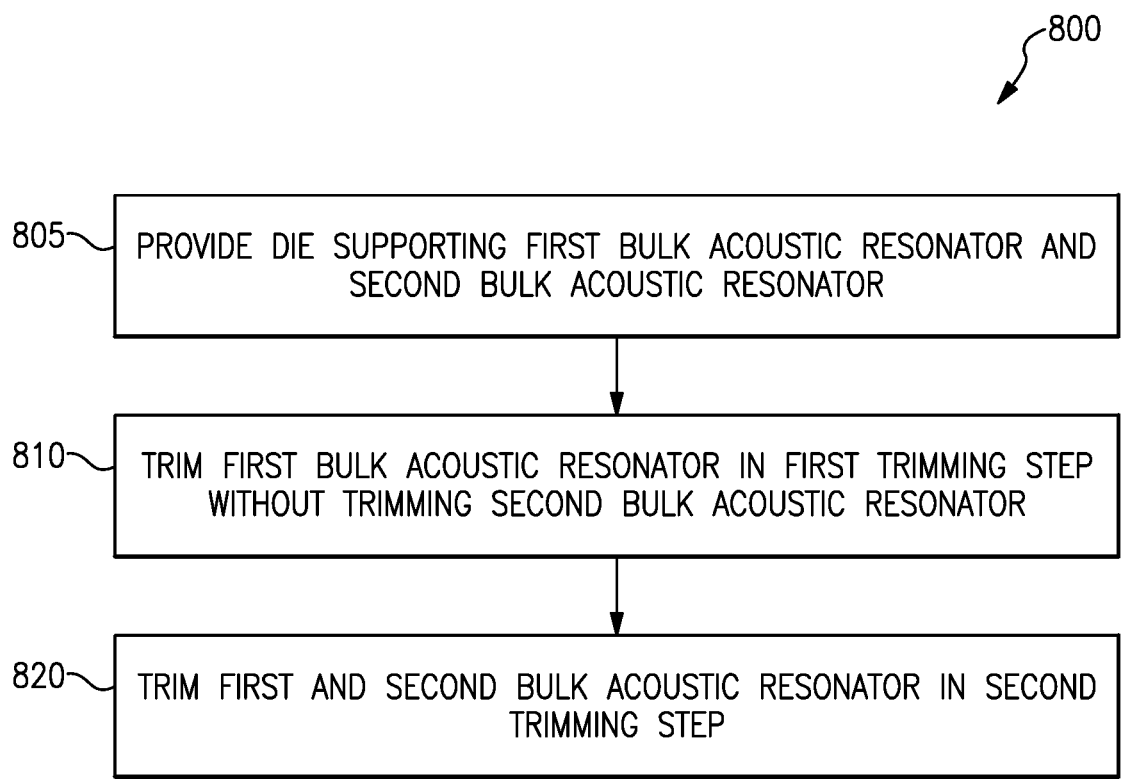
FIG. 8 is a flow diagram schematically illustrating certain steps in a process for trimming two BAW resonators on a single substrate including a shared trimming step in another embodiment.

FIG. 8 is a flow diagram schematically illustrating certain steps in a process 800 for trimming two BAW resonators on a single substrate including a shared trimming step in an embodiment. The cross sections of FIGS. 7A to 7F can correspond to the stages of the process 800. The process 800 begins at a stage 805 where a die is provided supporting a first BAW resonator and a second BAW resonator. In some embodiments, the first and second BAW resonators may form parts of first and second filters, respectively, where both filters are supported by the single die. These first and second BAW resonators may be provided with an untrimmed upper electrode, for example, as illustrated in FIGS. 7A and 7B. Alternatively, the first and second BAW resonators may be provided with central regions having thicknesses thinner than the thickness of surrounding raised frame regions.

The process 800 moves to a stage 810 where a first trimming step has been used to selectively trim the first BAW resonator without trimming the second BAW resonator. This selective trimming step may reduce the thickness of a central region of the first BAW resonator by a desired thickness, or may otherwise adjust a dimension of a portion of the upper electrode of the first BAW resonator. FIGS. 7C and 7D illustrate an example of the first and second BAW resonators after the first trimming step.

The process 800 moves to a stage 815 where a second trimming step has been used to trim both the first BAW resonator and the second BAW resonator. This second trimming step may reduce the thickness of central regions of both the first BAW resonator and the second BAW resonator by a desired thickness, or may otherwise adjust a dimension of portions of the upper electrodes of the first and second BAW resonators. The second trimming step can trim the thicknesses of the upper electrodes in the active regions of the first and second BAW resonators by approximately the same amount. FIGS. 7E and 7F illustrate an example of the first and second BAW resonators after the second trimming step. The steps of the process 800 can be performed in any suitable order. For example, the shared trimming step can be performed before a trimming step for one of the two resonators in certain instances.

Additional trimming steps not explicitly described herein may be used to trim these BAW resonators and/or additional BAW resonators not explicitly described with respect to process 800. In some embodiments, the orders of the first and second trimming steps may be reversed. After all trimming steps have been performed, a packaging process may be performed to form a package encapsulating the die, which includes the trimmed BAW resonators, in a single package.

In the embodiments described with respect to FIGS. 7A to 8, two trimming steps are used, and two different final thicknesses are provided. In other embodiments, additional manufacturing efficiencies can be achieved when larger numbers of BAW resonators are trimmed on a single substrate.

Figure 9D:
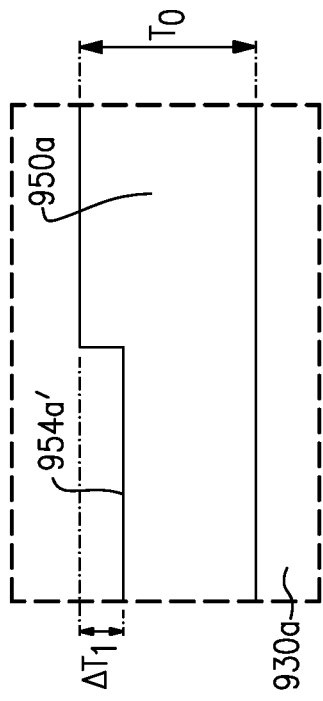
Figure 9D:
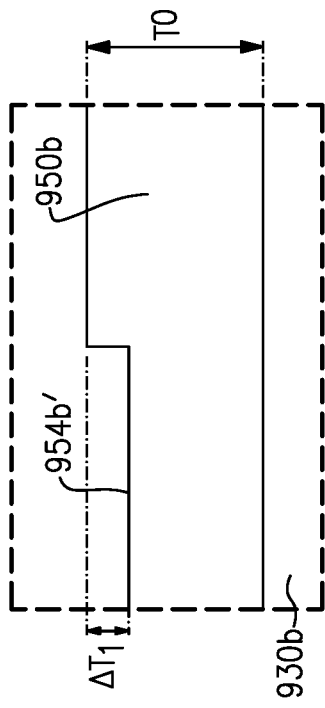
Figure 9D:
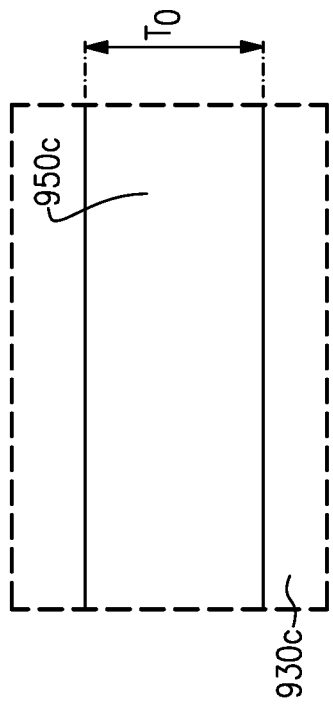
Figure 9D:
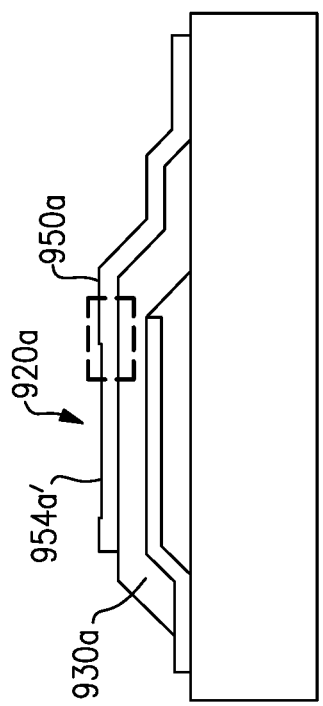

FIGS. 9A through 9I illustrate cross-sections of a portion of three BAW resonators at various stages of a manufacturing process including two shared trimming steps according to another embodiment. FIG. 9A shows a cross-section of a first BAW resonator 920a including an upper electrode 950a overlying a portion of a piezoelectric layer 930a, as well as a detail view of a portion of the upper electrode 950a. FIG. 9B shows a cross-section of a second BAW resonator 920b including an upper electrode 950b overlying a portion of a piezoelectric layer 930b, as well as a detail view of a portion of the upper electrode 950b. FIG. 9C shows a cross-section of a third BAW resonator 920c including an upper electrode 950c overlying a portion of a piezoelectric layer 930c, as well as a detail view of a portion of the upper electrode 950c.

Figure 9E:
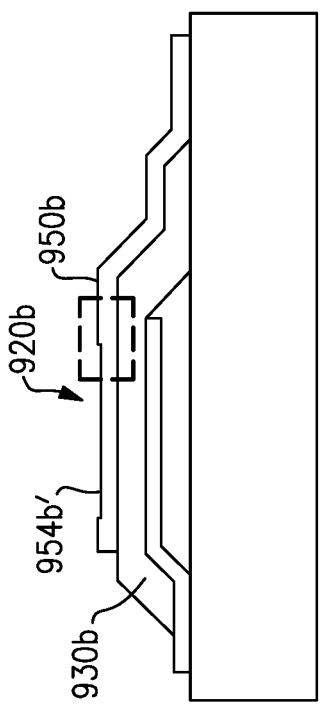
Figure 9F:
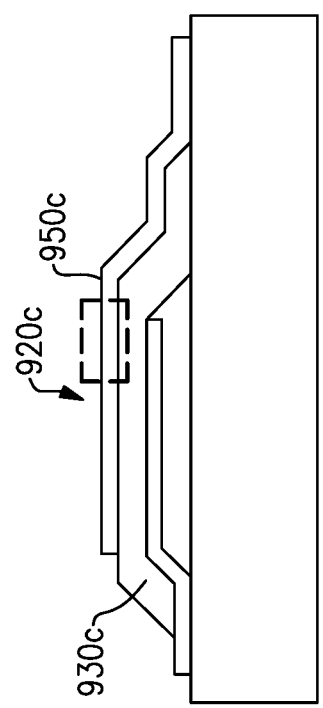

FIGS. 9D to 9F are cross-sections of the BAW resonators 920a, 920b, and 920c, respectively, after a first shared trimming step. As shown in FIG. 9D, the first shared trimming step reduces the thickness of a central region 954a' of the upper electrode 950a of the first BAW resonator 920a, while leaving the thickness of a frame region of the upper electrode 950a surrounding the central region 954a' at the initial thickness $T_0$. Similarly, FIG. 9E shows that the first shared trimming step reduces the thickness of a central region 954b' of the upper electrode 950b of the second BAW resonator 920b, while leaving the thickness of a frame region of the upper electrode 950b surrounding the central region 954b' at the initial thickness $T_0$. This first trimming step, however, has not been applied to the upper electrode 950c of the third BAW resonator 920c, which remains at the initial thickness $T_0$, as shown in FIG. 9F.

FIGS. 9G to 9I are cross-sections of the BAW resonators 920a, 920b, and 920c, respectively, after a second shared trimming step. In contrast to the first trimming step, which was applied to the first BAW resonator 920a and the second BAW resonator 920b, the second trimming step is applied to the first BAW resonator 920a and the third BAW resonator 920c. The zoomed in view of FIG. 9I shows that the second trimming step reduces the thickness of the central region 954c' of the upper electrode 950c of the third BAW resonator 920c by a thickness of $\Delta T_2$. This reduces the thickness of the central region 954c' of the upper electrode 950c of the second BAW resonator 920c to a final thickness of $T_{F3}$.

The zoomed in view of FIG. 9G shows that the second trimming step has reduced the thickness of the central region 954a" of the upper electrode 950a of the first BAW resonator 920a by an additional thickness of $\Delta T_2$. This reduces the thickness of the central region 954a" of the upper electrode 950a of the second BAW resonator 920a to a final thickness of $T_{F1}$, where $T_{F1}$ differs from the initial thickness $T_0$ of the upper electrode 950a by the sum of $\Delta T_1$ and $\Delta T_2$.

Because the second trimming step has not affected the second BAW resonator 920b, the thickness of the central region 954b' of the upper electrode 950b of the second BAW resonator 920b remains at a final thickness of $T_{F2}$, where $T_{F2}$ differs from the initial thickness $T_0$ of the upper electrode 950b by the thickness of $\Delta T_1$. The process illustrated in FIGS. 9A to 9I has, using only two shared trimming steps, formed BAW resonators having three different final thicknesses $T_{F1}$, $T_{F2}$, and $T_{F3}$.

This efficiency is possible because the overall trimming of first BAW resonator 920a can be defined as a sum of the trimming to be applied to the second and third BAW resonators 920b and 920c. With increased numbers of resonators on a single substrate, there is an increased likelihood that an overall amount of trimming for a given resonator can be defined in terms of a combination of trimming steps to be applied to one or more other resonators.

Figure 10:
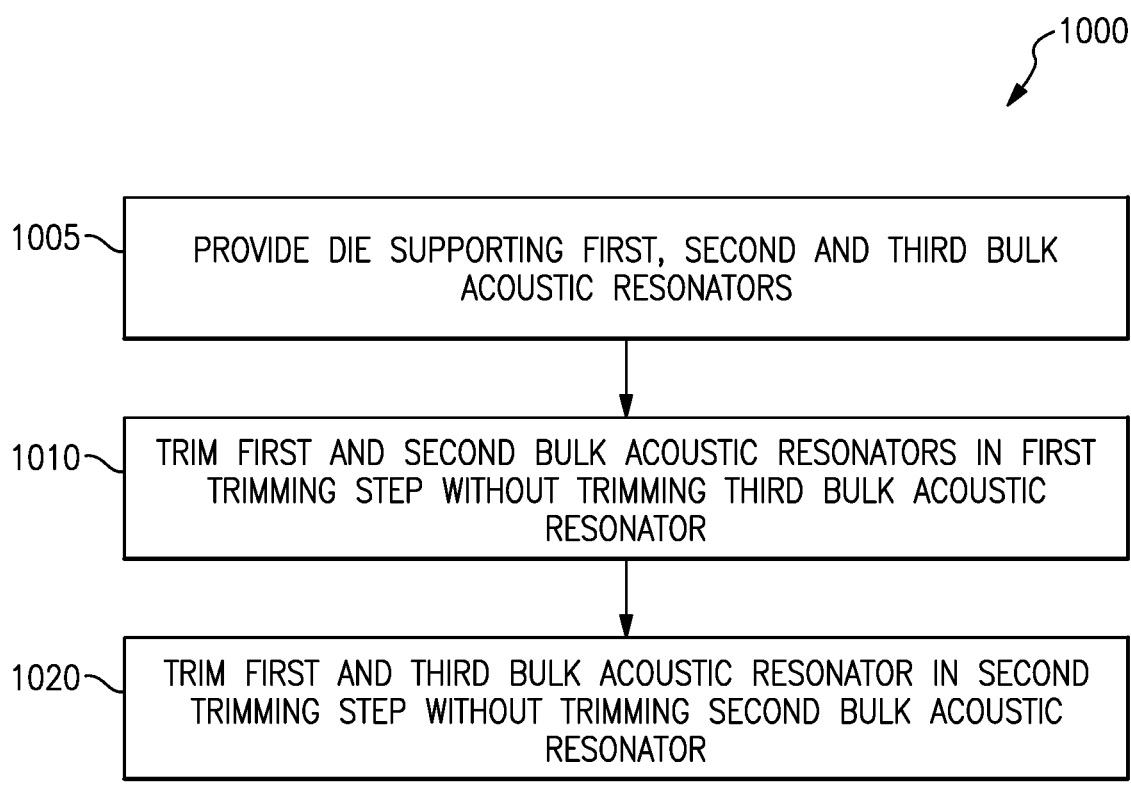
FIG. 10 is a flow diagram schematically illustrating certain steps in a process for trimming three BAW resonators on a single substrate including two shared trimming steps in another embodiment.

FIG. 10 is a flow diagram schematically illustrating certain steps in a process 1000 for trimming three BAW resonators on a single substrate including two shared trimming steps in another embodiment. The cross sections of FIGS. 9A to 9I can correspond to the stages of the process 1000. The process 1000 begins at a stage 1005 where a die is provided supporting first, second, and third BAW resonators. In some embodiments, these three BAW resonators may be included in two different filters on a single die. The two filters can include other BAW resonators on the single die. In certain instances, three BAW resonators on the single die can be included in three different filters. The first, second, and third BAW resonators may be provided with an untrimmed upper electrode, as illustrated in FIGS. 9A to 9C, or they may be provided with central regions having thicknesses thinner than the thickness of surrounding frame regions.

The process 1000 moves to a stage 1010 where a first trimming step has been used to selectively trim the first and second BAW resonators without trimming the third BAW resonator. This selective trimming step may reduce the thicknesses of central regions of the first and second BAW resonators by a desired thickness, or may otherwise adjust dimensions of portions of the upper electrodes of the first and second BAW resonators. FIGS. 9D to 9F illustrate an example of the first, second, and third BAW resonators after the first trimming step.

The process 1000 moves to a stage 1015 where a second trimming step has been used to selectively trim both the first and third BAW resonators without further trimming the second BAW resonator. This second trimming step may reduce the thickness of central regions of both the first BAW resonator and the third BAW resonator by a desired thickness, or may otherwise adjust a dimension of portions of the upper electrodes of the first and third BAW resonators. FIGS. 9G to 9I illustrate an example of the first, second, and third BAW resonators after the second trimming step. The steps of the process 1000 can be performed in any suitable order.

Additional trimming steps not explicitly described herein may be used to trim these resonators and/or additional resonators not explicitly described with respect to process 1000. In some embodiments, the orders of the first and second trimming steps may be reversed. After all trimming steps have been performed, a packaging process may be performed to form a package encapsulating the die, which includes the trimmed BAW resonators, in a single package.

Figure 11A:
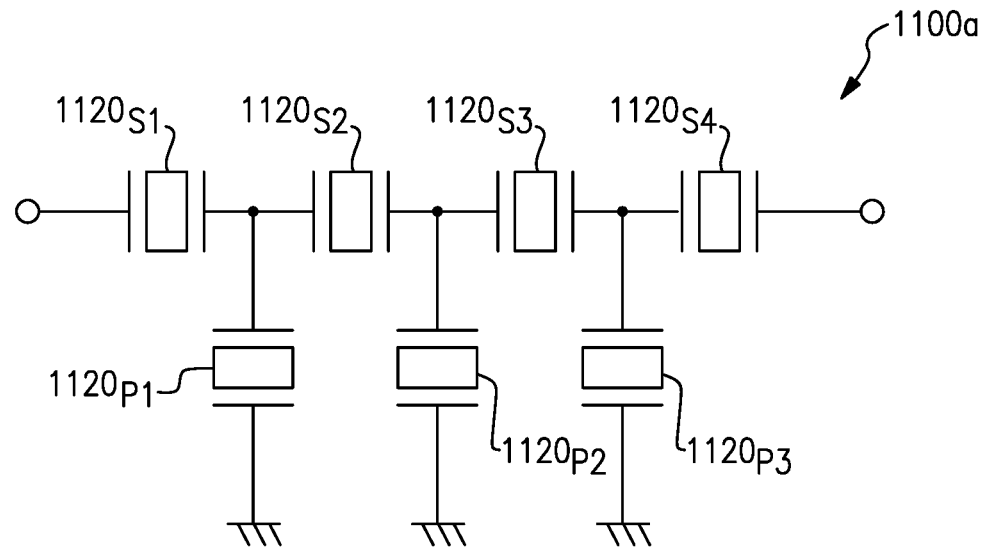
FIG. 11A is a top plan view schematically illustrating two BAW filters, each including a plurality of BAW resonators.
Figure 11A:
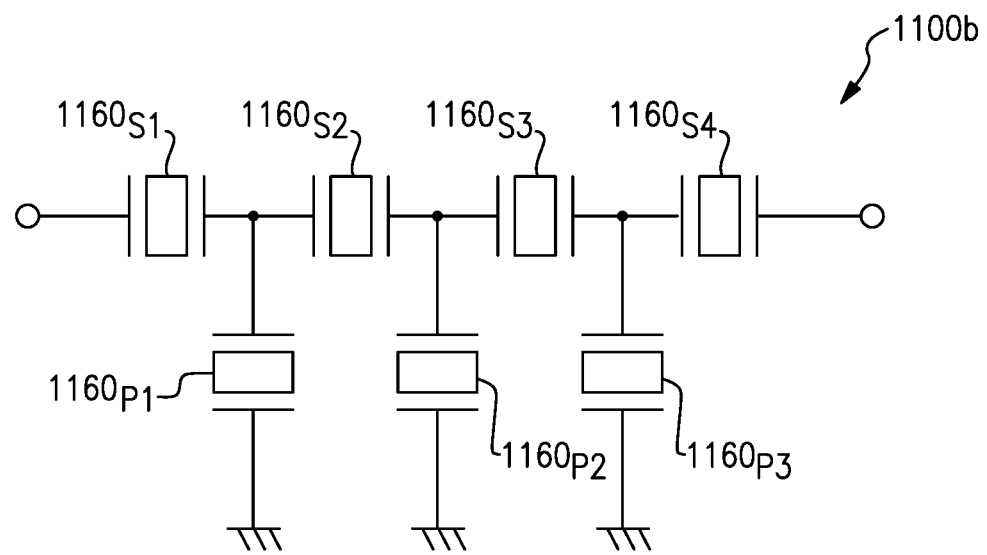

FIG. 11A is a top plan view schematically illustrating two BAW filters, each including a plurality of BAW resonators according to an embodiment. The illustrated first BAW filter 1100a and the second BAW filter 1100b are shown as standalone filters. These filters can alternatively be included in a multiplexer, such as a duplexer, and be electrically coupled to each other at a common node of the multiplexer.

The first BAW filter 1100a includes four series BAW resonators $1120_{S1}$, $1120_{S2}$, $1120_{S3}$, and $1120_{S4}$, and three shunt BAW resonators $1120_{P1}$, $1120_{P2}$, and $1120_{P3}$. One or more of the four series BAW resonators $1120_{S1}$, $1120_{S2}$, $1120_{S3}$, and $1120_{S4}$ can have a first resonant frequency $f_1$, and the remainder of the series BAW resonators can have a second resonant frequency $f_2$. One or more of the three shunt BAW resonators $1120_{P1}$, $1120_{P2}$, and $1120_{P3}$ can have a third resonant frequency $f_3$, and the remainder of the shunt BAW resonators can have a fourth resonant frequency $f_4$.

Similarly, the second BAW filter 1100b also includes four series BAW resonators $1160_{S1}$, $1160_{S2}$, $1160_{S3}$, and $1160_{S4}$, and three shunt BAW resonators $1160_{P1}$, $1160_{P2}$, and $1160_{P3}$. One or more of the four series BAW resonators $1160_{S1}$, $1160_{S2}$, $1160_{S3}$, and $1160_{S4}$ can have a fifth resonant frequency $f_5$, and the remainder of the series BAW resonators can have a sixth resonant frequency $f_6$. One or more of the three shunt BAW resonators $1160_{P1}$, $1160_{P2}$, and $1160_{P3}$ can have a seventh resonant frequency $f_7$, and the remainder of the shunt BAW resonators can have an eighth resonant frequency $f_8$.

If the first and second BAW filters 1100a and 1100b were formed on separate substrates, the formation of each of first and second BAW filters 1100a and 1100b would each involve at least 3 trimming steps. This would result in a total of at least 6 trimming steps to form the first and second BAW filters 1100a and 1100b, even when at least some of the resonant frequencies of BAW resonators of the first BAW filter 1100a and the second BAW filter 1100b are the same.

In contrast, if the first and second BAW filters 1100a and 1100b are formed on a common substrate of a multi-filter die, the first and second BAW filters 1100a and 1100b can include BAW resonators with at least some shared resonant frequencies and/or can include BAW resonators with at least some common resonant frequency differentials, such that shared trimming steps can be used to reduce the overall number of trimming steps to form both filters.

In one embodiment, the first and second BAW filters 1100a and 1100b can be designed such that one of the series resonator resonant frequencies is shared between the first and second BAW filters 1100a and 1100b, and both of the shunt resonator resonant frequencies are shared between the first and second BAW filters 1100a and 1100b. In such an embodiment, the second frequency $f_2$ may be equal to the sixth frequency $f_6$, the third frequency $f_3$ may be equal to the seventh frequency $f_7$, and the fourth frequency $f_4$ may be equal to the eighth frequency $f_8$. In such an embodiment, four trimming steps may be used to form the first and second BAW filters 1100a and 1100b. These steps are illustrated in Table 1, in which bold text is used to designate BAW resonators trimmed during a given trimming step and asterisks ** are used to designate the point at which a BAW resonator has been trimmed to its final resonant frequency. Each trimming step can shift an resonant frequency of a BAW resonator by a different amount. For example, each of the trimming steps can shift the resonant frequency by a different amount in a range from about 10 megahertz (MHz) to 100 MHz in certain embodiments.

TABLE 1

| Resonator | Start | Trim 1 | Trim 2 | Trim 3 | Trim 4 |
|---|---|---|---|---|---|
| $1120_{S1}$ | **$f_1$ | $f_1$ | $f_1$ | $f_1$ | $f_1$ |
| $1120_{S2}$ | $f_1$ | $f_1$ | $f_1$ | **$f_2$ | $f_2$ |
| $1120_{S3}$ | **$f_1$ | $f_1$ | $f_1$ | $f_1$ | $f_1$ |
| $1120_{S4}$ | $f_1$ | $f_1$ | $f_1$ | **$f_2$ | $f_2$ |
| $1120_{P1}$ | $f_1$ | **$f_3$ | $f_3$ | $f_3$ | $f_3$ |
| $1120_{P2}$ | $f_1$ | $f_3$ | $f_3$ | $f_3$ | **$f_4$ |
| $1120_{P3}$ | $f_1$ | **$f_3$ | $f_3$ | $f_3$ | $f_3$ |
| $1160_{S1}$ | $f_1$ | $f_1$ | **$f_5$ | $f_5$ | $f_5$ |
| $1160_{S2}$ | $f_1$ | $f_1$ | $f_1$ | **$f_2$ | $f_2$ |
| $1160_{S3}$ | $f_1$ | $f_1$ | $f_1$ | **$f_2$ | $f_2$ |
| $1160_{S4}$ | $f_1$ | $f_1$ | **$f_5$ | $f_5$ | $f_5$ |
| $1160_{P1}$ | $f_1$ | **$f_3$ | $f_3$ | $f_3$ | $f_3$ |
| $1160_{P2}$ | $f_1$ | **$f_3$ | $f_3$ | $f_3$ | $f_3$ |
| $1160_{P3}$ | $f_1$ | $f_3$ | $f_3$ | $f_3$ | **$f_4$ |

The BAW resonators of the BAW filters 1100a and 1100b may be formed with an initial resonant frequency $f_1$, which corresponds to the final resonant frequency of series resonators $1120_{S1}$ and $1120_{S3}$ of first BAW filter 1100a. No further trimming of series resonators $1120_{S1}$ and $1120_{S3}$ of first BAW filter 1100a is desired, and no trimming steps will be applied to these resonators.

The first trimming step may be a shared trimming step which is applied to resonators of both the first and second BAW filters 1100a and 1100b. In this embodiment, the first trimming step is applied to all of the shunt BAW resonators $1120_{P1}$, $1120_{P2}$, and $1120_{P3}$ of first BAW filter 1100a to all of the shunt BAW resonators $1160_{P1}$, $1160_{P2}$, and $1160_{P3}$ of second BAW filter 1100b, to adjust the resonant frequency of these shunt resonators from $f_1$ to $f_3$. This resonant frequency $f_3$ corresponds to the final resonant frequency of shunt resonators $1120_{P1}$ and $1120_{P3}$ of first BAW filter 1100a and shunt resonators $1160_{P1}$ and $1160_{P2}$ of second BAW filter 1100b, and no further trimming steps will be applied to these resonators.

The second trimming step is applied only to series BAW resonators $1160_{S1}$ and $1160_{S4}$ of second BAW filter 1100b, and adjusts the resonant frequency of these series resonators from $f_1$ to their final resonant frequency of $f_5$.

The third trimming step is another shared trimming step applied to series BAW resonators $1120_{S2}$ and $1120_{S4}$ of first BAW filter 1100a and to series BAW resonators $1160_{S2}$ and $1160_{S3}$ of second BAW filter 1100b to adjust the resonant frequency of these series resonators from $f_1$ to their final resonant frequency of $f_5$.

The fourth trimming step is another shared trimming step applied to shunt BAW resonator $1120_{P2}$ of first BAW filter 1100a and to shunt BAW resonator $1160_{P3}$ of second BAW filter 1100b. This trimming step adjusts the resonant frequency of shunt BAW resonator $1120_{P2}$ of first BAW filter 1100a and shunt BAW resonator $1160_{P3}$ of second BAW filter 1100b from $f_3$ to their final resonant frequency of $f_4$.

In this embodiment, the shunt BAW resonator $1120_{P2}$ of first BAW resonator 1100a and the shunt BAW resonator $1160_{P3}$ of second BAW filter 1100b are the only resonators exposed to multiple trimming steps, although in other embodiments, more or fewer resonators may be exposed to multiple trimming steps. Although identified as first through fourth trimming steps, the various trimming steps may in other embodiments be performed in any suitable order.

FIG. 11B is a top plan view schematically illustrating two BAW filters that are co-packaged and that each have a BAW resonators with the same resonant frequency. In FIG. 11B, BAW filters 1100a' and 1100b' are co-packaged within a single package 1170. The BAW filters 1100a' and 1100b' can include any suitable combination of features of the BAW filters 1100a and 1100b of FIG. 11A. BAW resonators of the BAW filters 1100a' and 1100b' can be trimmed with any suitable combination of features discussed with reference to Table 1 and/or Table 2. A packaging area 1174 surrounding the BAW filters 1100a' and 1100b' need not extend between the two filters 1100a' and 1100b', which should reduce the overall size of the package 1170 in comparison to separately packaging filters 1100a' and 1100b'.

FIG. 11B shows a zoomed in views of a first area 1172a of the first filter 1100a' and a second area 1172b of the second filter 1100b'. The first area 1172a and the second area 1172b are on the same area of a common substrate of a multi-filter die. In the first area 1172a, the first filter 1100a' includes the BAW resonator $1120_{P1}$. In the second area 1172b, the second filter 1100b' includes the BAW resonator $1160_{P1}$. As illustrated, the BAW resonators $1120_{P1}$ and $1160_{P1}$ are FBARs. As also illustrated, the BAW resonators $1120_{P1}$ and $1160_{P1}$ each include a raised frame structure. The BAW resonators $1120_{P1}$ and $1160_{P1}$ can include a common material stack.

The BAW resonators $1120_{P1}$ and $1160_{P1}$ can have the same resonant frequencies as each other. The resonant frequencies of the BAW resonators $1120_{P1}$ and $1160_{P1}$ can differ by no more than a processing variation associated with forming and trimming the BAW resonators $1120_{P1}$ and $1160_{P1}$. The BAW resonators $1120_{P1}$ and $1160_{P1}$ can have the resonant frequencies within 1 MHz of each other. The BAW resonators $1120_{P1}$ and $1160_{P1}$ can have the resonant frequencies within 0.5 MHz of each other. Two BAW resonators of different filters on a common multi-filter die can be located in any suitable area of the multi-filter die. In certain instances, three or more BAW resonators of at least two different filters on a common multi-filter die can have the same resonant frequency. The BAW resonators $1120_{P1}$ and $1160_{P1}$ having upper electrodes with the same thickness can contribute to these resonators having the same resonant frequencies. As used herein, the phrase "the same resonant frequency" is intended to encompass having exactly the same resonant frequency and to also encompass having resonant frequencies that vary within a processing variation associated with forming and trimming the BAW resonators.

In one particular embodiment, the resonators of BAW filters 1100a and 1100b may have an initial resonant frequency of 2366 MHz. The first trimming step may reduce the resonant frequency of the affected resonators by 97 MHz. The second trimming step may reduce the resonant frequency of the affected resonators by 15 MHz. The third trimming step may reduce the resonant frequency of the affected resonators by 29 MHz. The fourth trimming step may reduce the resonant frequency of the affected resonators by 19 MHz. In this example, each trimming step reduces the resonant frequency of the affected resonators. Table 2 illustrates the change in frequency at each step of this embodiment, in which bold text is used to designate BAW resonators trimmed during a given trimming step and asterisks ** are used to designate the point at which a BAW resonator has been trimmed to its final resonant frequency.

$f_2$ will also shift the resonant frequency of another resonator from $f_5$ to $f_6$, and that the same trimming step which shifts the resonant frequency of a resonator from $f_3$ to $f_4$ will also shift the resonant frequency of another resonator from $f_7$ to $f_8$.

In such an embodiment, five trimming steps may be used to form the first and second BAW filters 1100a and 1100b. These steps are illustrated in Table 2, in which bold text is used to designate BAW resonators trimmed during a given trimming step and asterisks ** are used to designate the point at which a BAW resonator has been trimmed to its final resonant frequency.

TABLE 3

| Resonator | Start | Trim 1 | Trim 2 | Trim 3 | Trim 4 | Trim 5 |
|---|---|---|---|---|---|---|
| $1120_{S1}$ | **$f_1$ | $f_1$ | $f_1$ | $f_1$ | $f_1$ | $f_1$ |
| $1120_{S2}$ | $f_1$ | $f_1$ | $f_1$ | **$f_2$ | $f_2$ | $f_2$ |
| $1120_{S3}$ | **$f_1$ | $f_1$ | $f_1$ | $f_1$ | f1 | $f_1$ |
| $1120_{S4}$ | $f_1$ | $f_1$ | $f_1$ | **$f_2$ | $f_2$ | $f_2$ |
| $1120_{P1}$ | $f_1$ | **$f_3$ | $f_3$ | $f_3$ | $f_3$ | $f_3$ |
| $1120_{P2}$ | $f_1$ | $f_3$ | $f_3$ | $f_3$ | $f_3$ | **$f_4$ |
| $1120_{P3}$ | $f_1$ | **$f_3$ | $f_3$ | $f_3$ | $f_3$ | $f_3$ |
| $1160_{S1}$ | $f_1$ | $f_1$ | **$f_5$ | $f_5$ | $f_5$ | $f_5$ |
| $1160_{S2}$ | $f_1$ | $f_1$ | $f_5$ | **$f_6$ | $f_5$ | $f_6$ |
| $1160_{S3}$ | $f_1$ | $f_1$ | $f_5$ | **$f_6$ | $f_5$ | $f_6$ |
| $1160_{S4}$ | $f_1$ | $f_1$ | **$f_5$ | $f_5$ | $f_5$ | $f_5$ |
| $1160_{P1}$ | $f_1$ | $f_3$ | $f_3$ | $f_3$ | **$f_7$ | $f_7$ |
| $1160_{P2}$ | $f_1$ | $f_3$ | $f_3$ | $f_3$ | **$f_7$ | $f_7$ |
| $1160_{P3}$ | $f_1$ | $f_3$ | $f_3$ | $f_3$ | $f_7$ | **$f_8$ |

The BAW resonators of the BAW filters 1100a and 1100b may be formed with an initial resonant frequency $f_1$, which corresponds to the final resonant frequency of series resonators $1120_{S1}$ and $1120_{S3}$ of first BAW filter 1100a. No further trimming of series resonators $1120_{S1}$ and $1120_{S3}$ of

TABLE 2

| Resonator | Start | Trim 1 (−97 MHz) | Trim 2 (−15 MHz) | Trim 3 (−29 MHz) | Trim 4 (−19 MHz) |
|---|---|---|---|---|---|
| $1120_{S1}$ | ** 2366 | 2366 | 2366 | 2366 | 2366 |
| $1120_{S2}$ | 2366 | 2366 | 2366 | ** 2337 | 2337 |
| $1120_{S3}$ | ** 2366 | 2366 | 2366 | 2366 | 2366 |
| $1120_{S4}$ | 2366 | 2366 | 2366 | ** 2337 | 2337 |
| $1120_{P1}$ | 2366 | ** 2269 | 2269 | 2269 | 2269 |
| $1120_{P2}$ | 2366 | 2269 | 2269 | 2269 | ** 2250 |
| $1120_{P3}$ | 2366 | ** 2269 | 2269 | 2269 | 2269 |
| $1160_{S1}$ | 2366 | 2366 | ** 2351 | 2351 | 2351 |
| $1160_{S2}$ | 2366 | 2366 | 2366 | ** 2337 | 2337 |
| $1160_{S3}$ | 2366 | 2366 | 2366 | ** 2337 | 2337 |
| $1160_{S4}$ | 2366 | 2366 | ** 2351 | 2351 | 2351 |
| $1160_{P1}$ | 2366 | ** 2269 | 2269 | 2269 | 2269 |
| $1160_{P2}$ | 2366 | ** 2269 | 2269 | 2269 | 2269 |
| $1160_{P3}$ | 2366 | 2269 | 2269 | 2269 | ** 2250 |

In another embodiment, the first and second BAW filters 1100a and 1100b can be designed such that, despite having no resonant frequencies of BAW resonators in common, certain frequency differentials are shared between BAW resonators of each of the two filters 1100a and 1100b. For example, the filters 1100a and 1100b can be designed such that the difference between the series resonator resonant frequencies of filter 1100a ($f_1-f_2$) is equal to the difference between the series resonator resonant frequencies of filter 1100b ($f_5-f_6$), and the difference between the shunt resonator resonant frequencies of filter 1100a ($f_3-f_4$) is equal to the difference between the shunt resonator resonant frequencies of filter 1100b ($f_7-f_8$). In particular, these resonant frequencies may be designed such that the same trimming step which shifts the resonant frequency of a resonator from $f_1$ to first BAW filter 1100a is desired, and no trimming steps will be applied to these resonators.

The first trimming step may be a shared trimming step which is applied to resonators of both the first and second BAW filter 1100a and 1100b. In this embodiment, the first trimming step is applied to all of the shunt BAW resonators $1120_{P1}$, $1120_{P2}$, and $1120_{P3}$ of first BAW filter 1100a and to all of the shunt BAW resonators $1160_{P1}$, $1160_{P2}$, and $1160_{P3}$ of second BAW filter 1100b, to adjust the resonant frequency of these shunt resonators from $f_1$ to $f_3$. This resonant frequency $f_3$ corresponds to the final resonant frequency of shunt resonators $1120_{P1}$ and $1120_{P3}$ of first BAW filter 1100a, and no further trimming steps will be applied to these resonators.

The second trimming step is applied only to the series BAW resonators $1160_{S1}$, $1160_{S2}$, $1160_{S3}$, and $1160_{S4}$ of second BAW filter 1100b, and adjusts the resonant frequency of these series resonators from $f_1$ to an resonant frequency of $f_5$. For series BAW resonators $1160_{S1}$ and $1160_{S4}$ of second BAW filter 1100b, the resonant frequency of $f_5$ corresponds to the final resonant frequency, and no further trimming steps will be applied to these resonators.

The third trimming step is another shared trimming step applied to series BAW resonators $1120_{S2}$ and $1120_{S4}$ of first BAW filter 1100a and to series BAW resonators $1160_{S2}$ and $1160_{S3}$ of second BAW filter 1100b to adjust the resonant frequency of these series resonators. This trimming step adjusts the resonant frequency of series BAW resonators $1120_{S2}$ and $1120_{S4}$ of first BAW filter 1100a from $f_1$ to their final resonant frequency of $f_2$. As the series BAW resonators $1160_{S2}$ and $1160_{S3}$ of second BAW filter 1100b have already been trimmed in the second trimming step, the resonant frequency of the series BAW resonators $1160_{S2}$ and $1160_{S3}$ of second BAW filter 1100b is instead adjusted from $f_5$ to their final resonant frequency of $f_6$. No further trimming steps will be applied to these resonators.

The fourth trimming step is applied only to the shunt BAW resonators $1160_{P1}$, $1160_{P2}$, and $1160_{P3}$ of second BAW filter 1100b. This trimming step adjusts the resonant frequency of shunt BAW resonators $1160_{P1}$, $1160_{P2}$, and $1160_{P3}$ of second BAW filter 1100b from $f_3$ to $f_7$. For shunt BAW resonators $1160_{P1}$ and $1160_{P2}$, $f_7$ represents their final resonant frequency, and no further trimming steps will be applied.

The fifth trimming step is another shared trimming step applied to shunt BAW resonator $1120_{P2}$ of first BAW filter 1100a and to shunt BAW resonator $1160_{P3}$ of second BAW filter 1100b Like the third trimming step described above, this fifth trimming step again applies a shared trimming step to resonators of two different frequencies. This trimming step adjusts the resonant frequency of shunt BAW resonator $1120_{P2}$ of first BAW filter 1100a from $f_3$ to its final resonant frequency of $f_4$, and adjusts the shunt BAW resonator $1160_{P3}$ of second BAW filter 1100b from $f_7$ to its final resonant frequency of $f_8$.

In this embodiment, three shared trimming steps are applied to resonators of both filters, and two filters have been formed, each of which have 4 distinct BAW resonator resonant frequencies representing eight total unique BAW resonator resonant frequencies. A reduction in trimming steps from 6 to 5 has been achieved, even though neither of the filters share a common resonator resonant frequency with the other filter. Although identified as first through fifth trimming steps, the various trimming steps may in other embodiments be performed in any suitable order, and more or fewer resonators may be exposed to multiple trimming steps.

In this embodiment, the shunt BAW resonator $1120_{P2}$ of first BAW filter 1100a and the shunt BAW resonator $1160_{P3}$ of second BAW filter 1100b are the only resonators exposed to multiple trimming steps, although in other embodiments, more or fewer resonators may be exposed to multiple trimming steps.

FIG. 11C is a top plan view schematically illustrating two BAW filters that are co-packaged and that each have two BAW resonators with the same differential in resonant frequency. In FIG. 11C, BAW filters 1100a" and 1100b" are co-packaged within a single package 1180. The BAW filters 1100a" and 1100b" can include any suitable combination of features of the BAW filters 1100a and 1100b of FIG. 11A. BAW resonators of the BAW filters 1100a" and 1100b" can be trimmed with any suitable combination of features discussed with reference to Table 3 and/or Table 4. Any suitable combination of features discussed with reference to FIG. 11B can be combined with any suitable combination of features discussed with reference to FIG. 11C. A packaging area 1184 surrounding the BAW filters 1100a" and 1100b" need not extend between the two filters 1100a" and 1100b", which should reduce the overall size of the package 1180 in comparison to separately packaging filters 1100a" and 1100b".

FIG. 11C shows a zoomed in views of a first area 1182a1 and a second area 1182a2 of the first filter 1100a" and a third area 1182b1 and a fourth area 1182b2 of the second filter 1100b". The first to fourth areas 1182a1, 1182a2, 1182b1, 1182b2 are on the same area of a common substrate of a multi-filter die. In the first area 1182a1, the first filter 1100a" includes the BAW resonator $1120_{S1}$. In the second area 1182a1, the first filter 1100a" includes the BAW resonator $1120_{S2}$. In the third area 1182b1, the second filter 1100b" includes the BAW resonator $1160_{S1}$. In the fourth area 1182b2, the second filter 1100b" includes the BAW resonator $1160_{S2}$.

As illustrated, the BAW resonators $1120_{S1}$, $1120_{S2}$, $1160_{S1}$, and $1160_{S2}$ are FBARs. As also illustrated, the BAW resonators $1120_{S1}$, $1120_{S2}$, $1160_{S1}$, and $1160_{S2}$ each include a raised frame structure. The BAW resonators $1120_{S1}$, $1120_{S2}$, $1160_{S1}$, and $1160_{S2}$ can include a common material stack.

A difference between resonant frequencies of the BAW resonators $1120_{S1}$ and $1120_{S2}$ of the first filter 1100a" is approximately equal to a difference between resonant frequencies of the BAW resonators $1160_{S1}$ and $1160_{S2}$ of the second filter 1100b". The difference in resonant frequencies of the BAW resonators $1120_{S1}$ and $1120_{S2}$ and the difference in resonant frequencies of the BAW resonators $1160_{S1}$ and $1160_{S2}$ can differ by no more than an amount associated with processing variation associated with forming and trimming these BAW resonators. The difference between resonant frequencies of the BAW resonators $1120_{S1}$ and $1120_{S2}$ can be within 1% of the difference between resonant frequencies of the BAW resonators $1160_{S1}$ and $1160_{S2}$. The difference between resonant frequencies of the BAW resonators $1120_{S1}$ and $1120_{S2}$ can be within 2% of the difference between resonant frequencies of the BAW resonators $1160_{S1}$ and $1160_{S2}$. The BAW resonators of different filters on a common multi-filter die can be located in any suitable area of the multi-filter die. In certain instances, three or more groups of two BAW resonators of at least two different filters on a common multi-filter die can have the same difference is resonant frequencies as each other. The differences in resonant frequencies can correspond to differences in thickness of upper electrodes in a central portion of an active area of the BAW resonators. As used herein, the phrase "equal to a difference between resonant frequencies" is intended to encompass having exactly the same difference between resonant frequencies and to also encompass having a difference between resonant frequencies within processing variation associated with forming and trimming the BAW resonators.

In one particular embodiment, the resonators of BAW filters 1100a and 1100b may have an initial resonant frequency of 2366 MHz. The first trimming step may reduce the resonant frequency of the affected resonators by 97 MHz. The second trimming step may reduce the resonant frequency of the affected resonators by 15 MHz. The third trimming step may reduce the resonant frequency of the affected resonators by 29 MHz. The fourth trimming step may reduce the resonant frequency of the affected resonators by 9 MHz. The fifth trimming step may reduce the resonant frequency of the affected resonators by 19 MHz. Table 4 illustrates the change in frequency at each step of this embodiment, in which bold text is used to designate BAW resonators trimmed during a given trimming step and asterisks ** are used to designate the point at which a BAW resonator has been trimmed to its final resonant frequency.

TABLE 4

| Resonator | Start | Trim 1 (−97 MHz) | Trim 2 (−15 MHz) | Trim 3 (−29 MHz) | Trim 4 (−9 MHz) | Trim 5 (−19 MHz) |
|---|---|---|---|---|---|---|
| $1120_{S1}$ | ** 2366 | 2366 | 2366 | 2366 | 2366 | 2366 |
| $1120_{S2}$ | 2366 | 2366 | 2366 | ** 2337 | 2337 | 2337 |
| $1120_{S3}$ | ** 2366 | 2366 | 2366 | 2366 | 2366 | 2366 |
| $1120_{S4}$ | 2366 | 2366 | 2366 | ** 2337 | 2337 | 2337 |
| $1120_{P1}$ | 2366 | ** 2269 | 2269 | 2269 | 2269 | 2269 |
| $1120_{P2}$ | 2366 | 2269 | 2269 | 2269 | 2269 | ** 2250 |
| $1120_{P3}$ | 2366 | ** 2269 | 2269 | 2269 | 2269 | 2269 |
| $1160_{S1}$ | 2366 | 2366 | ** 2351 | 2351 | 2351 | 2351 |
| $1160_{S2}$ | 2366 | 2366 | 2351 | ** 2322 | 2322 | 2322 |
| $1160_{S3}$ | 2366 | 2366 | 2351 | ** 2322 | 2322 | 2322 |
| $1160_{S4}$ | 2366 | 2366 | ** 2351 | 2351 | 2351 | 2351 |
| $1160_{P1}$ | 2366 | 2269 | 2269 | 2269 | ** 2260 | 2260 |
| $1160_{P2}$ | 2366 | 2269 | 2269 | 2269 | ** 2260 | 2230 |
| $1160_{P3}$ | 2366 | 2269 | 2269 | 2269 | 2260 | ** 2241 |

In the above example, the frequency change caused by a trimming process is substantially constant, even when the layers being trimmed are at different initial thicknesses prior to the performance of that trimming step. However, depending on the nature of the layer stack being trimmed, and the thickness of the trimmed layer relative to the amount being trimmed, the relationship between trim depth and frequency change may be non-linear.

In such an embodiment, a given trimming process applied to two layers of different thicknesses may result in a frequency change for one layer which is different than the frequency change for the other layer. In such embodiments, filters on a single substrate may still be designed such that shared trimming processes can be used to form the filters, even though the exact frequency changes resulting from those trimming processes may be different in different filters.

Multi-filter substrates having a plurality of BAW filters can be packaged as described above with respect to FIGS. 3A to 4C, or using any other suitable packaging process. In some embodiments, acoustic wave resonators of other types, such as SAW resonators and/or Lamb wave resonators, may also be co-packaged with one or more BAW filters.

Figure 12:
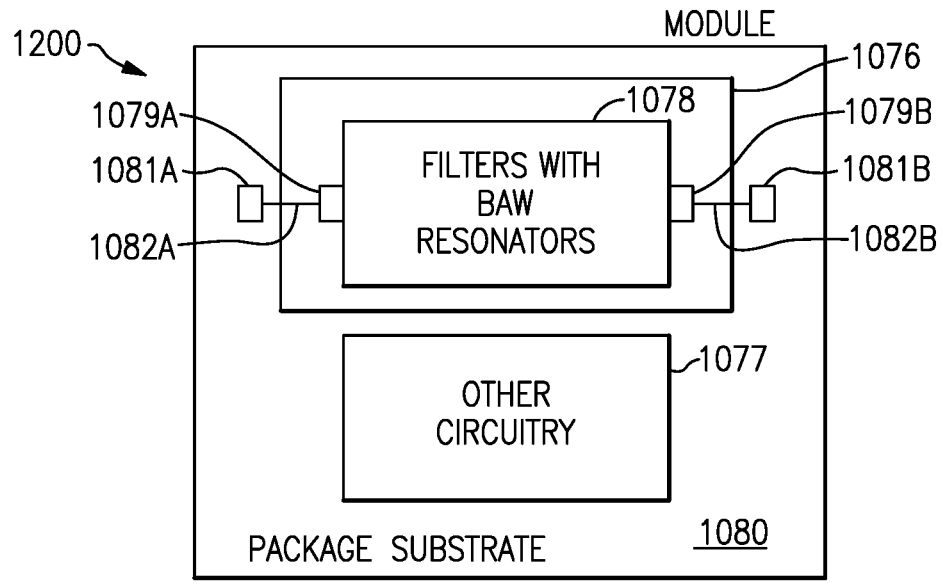
FIG. 12 is a schematic diagram of a radio frequency module that includes a filter with BAW resonators according to an embodiment.

FIG. 12 is a schematic diagram of a radio frequency module 1200 that includes a bulk acoustic wave component 1076 according to an embodiment. The illustrated radio frequency module 1200 includes the BAW component 1076 and other circuitry 1077. The BAW component 1076 can include BAW filters with any suitable combination of features of the BAW filters disclosed herein. The BAW component 1076 can include a BAW die that includes BAW resonators of multiple filters.

The BAW component 1076 shown in FIG. 12 includes filters 1078 and terminals 1079A and 1079B. The filters 1078 includes BAW resonators, and may be co-packaged with another filter including BAW resonators, or with another acoustic wave resonator in accordance with any suitable principles and advantages disclosed herein. The terminals 1079A and 1078B can serve, for example, as an input contact and an output contact, and may be in electrical communication with a conductive structure extending through a laser-etched via. The BAW component 1076 and the other circuitry 1077 are on or supported by a common packaging substrate 1080 in FIG. 12. The package substrate 1080 can be a laminate substrate. The terminals 1079A and 1079B can be electrically connected to contacts 1081A and 1081B, respectively, on or supported by the packaging substrate 1080 by way of electrical connectors 1082A and 1082B, respectively. The electrical connectors 1082A and 1082B can be bumps or wire bonds, for example. The other circuitry 1077 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 1200 can include one or more packaging structures to, for example, provide protection and/or facilitate easier handling of the radio frequency module 1200. Such a packaging structure can include an overmold structure formed over the packaging substrate 1200. The overmold structure can encapsulate some or all of the components of the radio frequency module 1200.

Figure 13:
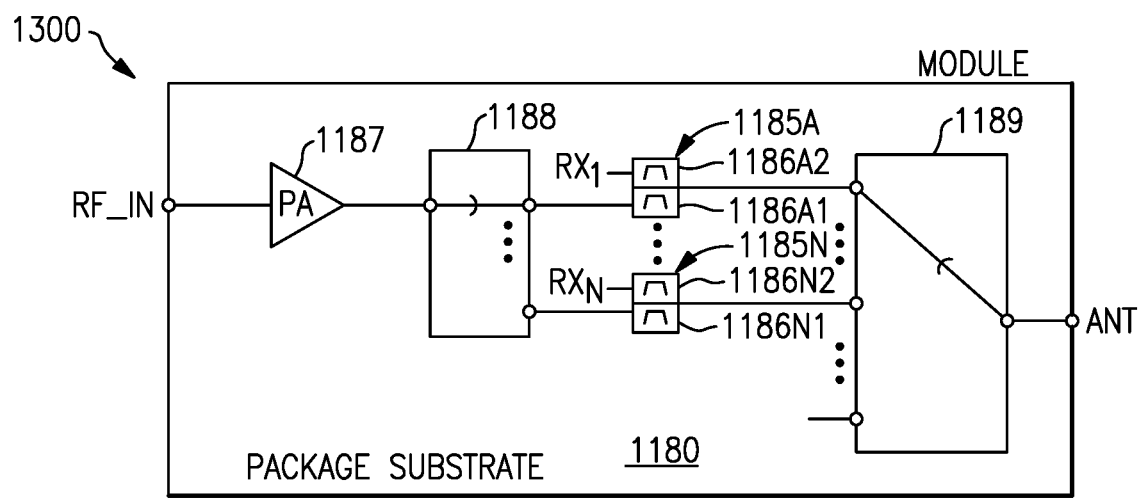
FIG. 13 is a schematic diagram of a radio frequency module that includes duplexers with BAW resonators according to an embodiment.

FIG. 13 is a schematic diagram of a radio frequency module 1300 that includes a bulk acoustic wave component according to an embodiment. As illustrated, the radio frequency module 1300 includes duplexers 1185A to 1185N that include respective transmit filters 1186A1 to 1186N1 and respective receive filters 1186A2 to 1186N2, a power amplifier 1187, a select switch 1188, and an antenna switch 1189. The radio frequency module 1300 can include a package that encloses the illustrated elements. The illustrated elements can be disposed on a common packaging substrate 1180. The packaging substrate can be a laminate substrate, for example.

The duplexers 1185A to 1185N can each include two acoustic wave filters coupled to a common node. The two acoustic wave filters can be a transmit filter and a receive filter, and may be co-packaged with one another. As illustrated, the transmit filter and the receive filter can each be band pass filters arranged to filter a radio frequency signal. One or more of the transmit filters 1186A1 to 1186N1 can include one or more BAW filters in accordance with any suitable principles and advantages disclosed herein. Similarly, one or more of the receive filters 1186A2 to 1186N2 can include one or more BAW filters in accordance with any suitable principles and advantages disclosed herein. Although FIG. 13 illustrates duplexers, any suitable principles and advantages disclosed herein can be implemented in other multiplexers (e.g., quadplexers, hexaplexers, octoplexers, etc.) and/or in switch-plexers.

The power amplifier 1187 can amplify a radio frequency signal. The illustrated switch 1188 is a multi-throw radio frequency switch. The switch 1188 can electrically couple an output of the power amplifier 1187 to a selected transmit filter of the transmit filters 1186A1 to 1186N1. In some instances, the switch 1188 can electrically connect the output of the power amplifier 1187 to more than one of the transmit filters 1186A1 to 1186N1. The antenna switch 1189 can selectively couple a signal from one or more of the duplexers 1185A to 1185N to an antenna port ANT. The duplexers 1185A to 1185N can be associated with different frequency bands and/or different modes of operation (e.g., different power modes, different signaling modes, etc.).

Figure 14B:
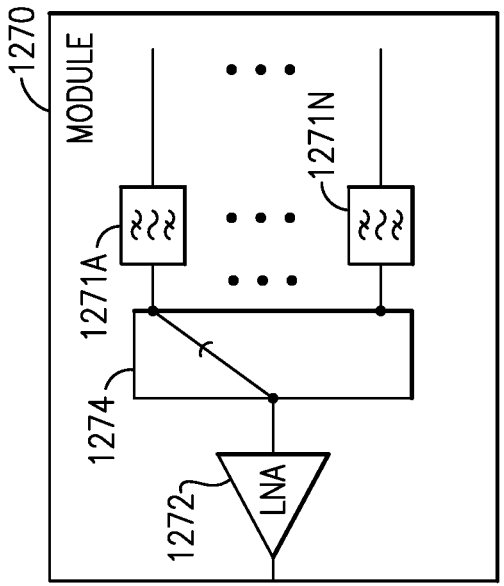
FIG. 14B is a schematic block diagram of a module that includes a low noise amplifier, a radio frequency switch, and bulk acoustic wave filters according to an embodiment.
Figure 14A:
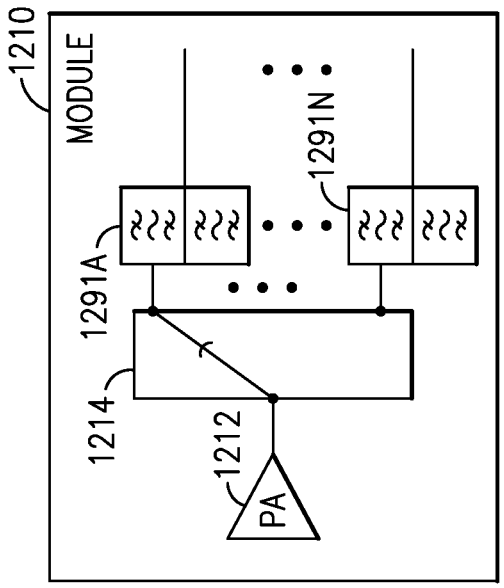
FIG. 14A is a schematic block diagram of a module that includes a power amplifier, a radio frequency switch, and duplexers that include one or more BAW resonators according to an embodiment.

FIG. 14A is a schematic block diagram of a module 1210 that includes a power amplifier 1212, a radio frequency switch 1214, and duplexers 1291A to 1291N in accordance with one or more embodiments. The power amplifier 1212 can amplify a radio frequency signal. The radio frequency switch 1214 can be a multi-throw radio frequency switch. The radio frequency switch 1214 can electrically couple an output of the power amplifier 1212 to a selected transmit filter of the duplexers 1291A to 1291N. One or more filters of the duplexers 1291A to 1291N can include any suitable number of bulk acoustic wave resonators, in accordance with any suitable principles and advantages discussed herein, and some or all of the filters may be co-packaged as discussed above. Any suitable number of duplexers 1291A to 1291N can be implemented.

FIG. 14B is a schematic block diagram of a module 1270 that includes filters 1271A to 1271N, a radio frequency switch 1274, and a low noise amplifier 1272 according to an embodiment. One or more filters of the filters 1271A to 1271N can include any suitable number of bulk acoustic wave resonators, in accordance with any suitable principles and advantages discussed herein, and some or all of the filters may be co-packaged as discussed above. Any suitable number of filters 1271A to 1271N can be implemented. The illustrated filters 1271A to 1271N are receive filters. In some embodiments (not illustrated), one or more of the filters 1271A to 1271N can be included in a multiplexer that also includes a transmit filter. The radio frequency switch 1274 can be a multi-throw radio frequency switch. The radio frequency switch 1274 can electrically couple an output of a selected filter of filters 1271A to 1271N to the low noise amplifier 1272. In some embodiments (not illustrated), a plurality of low noise amplifiers can be implemented. The module 1270 can include diversity receive features in certain applications.

Figure 15:
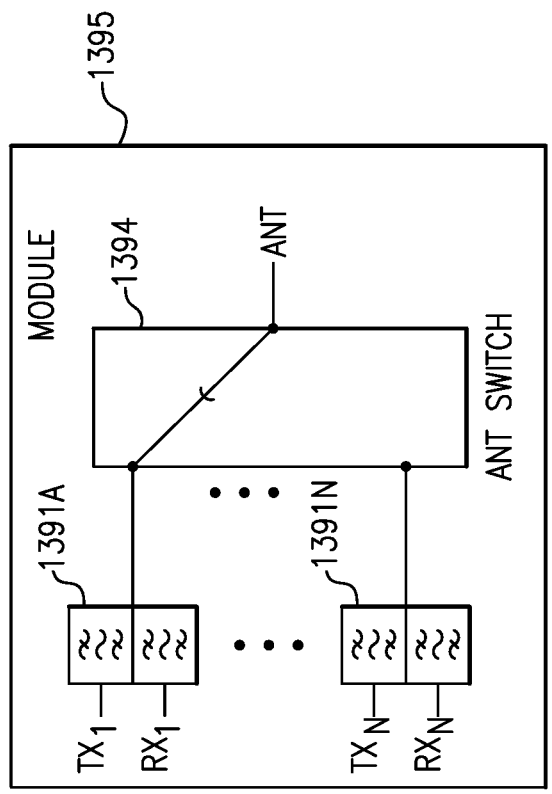
FIG. 15 is a schematic block diagram of a module that includes an antenna switch and duplexers that include one or more BAW resonators according to an embodiment.

FIG. 15 is a schematic block diagram of a module 1395 that includes duplexers 1391A to 1391N and an antenna switch 1394. One or more filters of the duplexers 1391A to 1391N can be co-packaged with one another and may include any suitable number of bulk acoustic wave resonators, in accordance with any suitable principles and advantages discussed herein. Any suitable number of duplexers 1391A to 1391N can be implemented. The antenna switch 1394 can have a number of throws corresponding to the number of duplexers 1391A to 1391N. The antenna switch 1394 can electrically couple a selected duplexer to an antenna port of the module 1395.

Figure 16A:
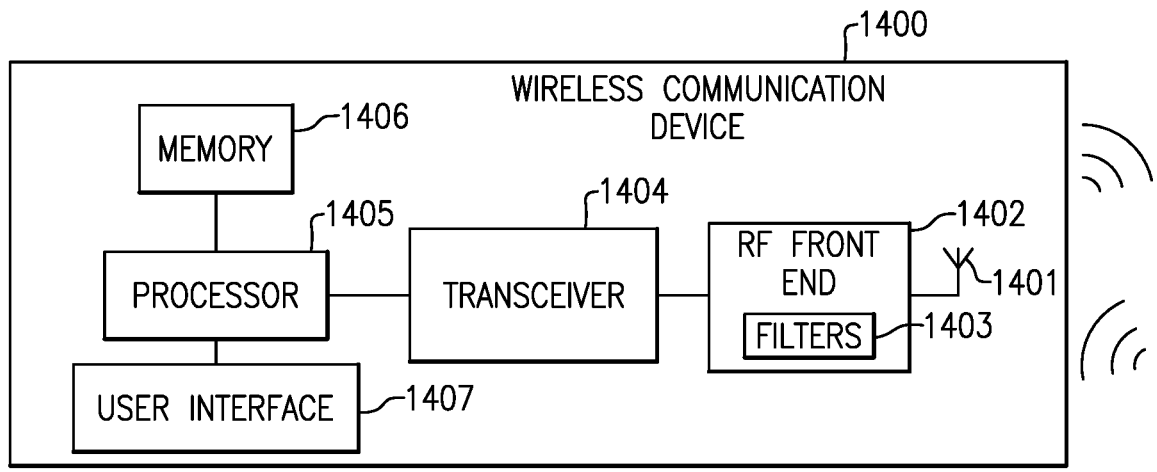
FIG. 16A is a schematic block diagram of a wireless communication device that includes a BAW filter in accordance with one or more embodiments.

FIG. 16A is a schematic diagram of a wireless communication device 1400 that includes filters 1403 in a radio frequency front end 1402 according to an embodiment. The filters 1403 can include BAW resonators of two or more filters in accordance with any suitable principles and advantages discussed herein. The wireless communication device 1400 can be any suitable wireless communication device. For instance, a wireless communication device 1400 can be a mobile phone, such as a smart phone. As illustrated, the wireless communication device 1400 includes an antenna 1401, an RF front end 1402, a transceiver 1404, a processor 1405, a memory 1406, and a user interface 1407. The antenna 1401 can transmit RF signals provided by the RF front end 1402. Such RF signals can include carrier aggregation signals. Although not illustrated, the wireless communication device 1400 can include a microphone and a speaker in certain applications.

The RF front end 1402 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 1402 can transmit and receive RF signals associated with any suitable communication standards. The filters 1403 may be co-packaged with one another, or with a subset of the filters 1403, and can include BAW resonators including any suitable combination of features discussed with reference to any embodiments discussed above.

The transceiver 1404 can provide RF signals to the RF front end 1402 for amplification and/or other processing. The transceiver 1404 can also process an RF signal provided by a low noise amplifier of the RF front end 1402. The transceiver 1404 is in communication with the processor 1405. The processor 1405 can be a baseband processor. The processor 1405 can provide any suitable base band processing functions for the wireless communication device 1400. The memory 1406 can be accessed by the processor 1405. The memory 1406 can store any suitable data for the wireless communication device 1400. The user interface 1407 can be any suitable user interface, such as a display with touch screen capabilities.

Figure 16B:
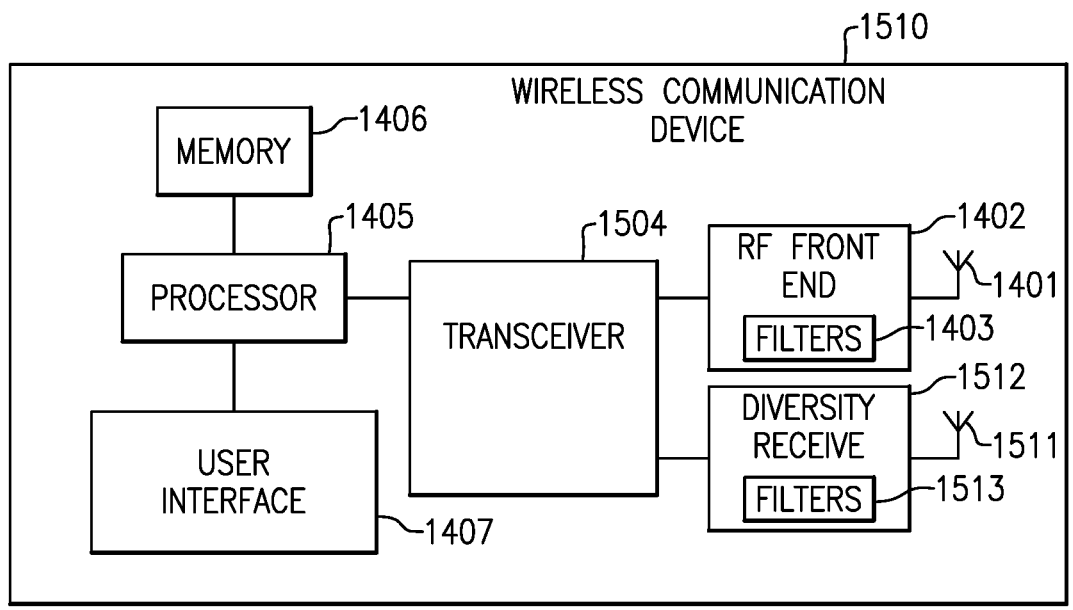
FIG. 16B is a schematic block diagram of another wireless communication device that includes a BAW filter in accordance with one or more embodiments.

FIG. 16B is a schematic diagram of a wireless communication device 1510 that includes filters 1503 in a radio frequency front end 1502 and second filters 1513 in a diversity receive module 1512. The wireless communication device 1510 is like the wireless communication device 1400 of FIG. 16A, except that the wireless communication device 1520 also includes diversity receive features. As illustrated in FIG. 16B, the wireless communication device 1520 includes a diversity antenna 1511, a diversity module 1512 configured to process signals received by the diversity antenna 1511 and including filters 1513, and a transceiver 1504 in communication with both the radio frequency front end 1502 and the diversity receive module 1512. The filters 1513 may be co-packaged with one another, or with a subset of the filters 1513, and can include BAW resonators including any suitable combination of features discussed with reference to any embodiments discussed above.

Acoustic wave resonators disclosed herein can be included in a filter arranged to filter a radio frequency signal. One or more acoustic wave resonators including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include BAW resonators disclosed herein. FR1 can be from 410 megahertz (MHz) to 7.125 gigahertz (GHz), for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band. One or more acoustic wave resonators in accordance with any suitable principles and advantages disclosed herein can be included in a filter having a passband that includes a 4G LTE operating band and a 5G NR operating band.

Any of the embodiments described above can be implemented in mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kHz to 300 GHz, such as a frequency in a range from about 410 MHz to 8.5 GHz.

Aspects of this disclosure can be implemented in various electronic devices. Examples of the electronic devices can include, but are not limited to, consumer electronic products, parts of the consumer electronic products such as die and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A multi-filter die with bulk acoustic wave filters, the multi-filter die comprising:
 a first filter located in a first region of a substrate, the first filter including a first plurality of bulk acoustic wave resonators, and the first plurality of bulk acoustic wave resonators each including a raised frame structure; and
 a second filter located in a second region of the substrate, the second filter including a second plurality of bulk acoustic wave resonators, at least one of the first plurality of bulk acoustic wave resonators having the same resonant frequency as at least one of the second plurality of bulk acoustic wave resonators.

2. The multi-filter die of claim 1 wherein the first and second filters are included in a multiplexer.

3. The multi-filter die of claim 2 wherein the first and second filters are electrically connected to one another at a common contact by at least one electrical connection of the multi-filter die.

4. A multi-filter die with bulk acoustic wave filters, the multi-filter die comprising:
 a first filter located in a first region of a substrate, the first filter including a first plurality of bulk acoustic wave resonators; and
 a second filter located in a second region of the substrate, the second filter including a second plurality of bulk acoustic wave resonators, at least one of the first plurality of bulk acoustic wave resonators having the same resonant frequency as at least one of the second plurality of bulk acoustic wave resonators, and the multi-filter die is free from electrical connections between the first filter and the second filter.

5. The multi-filter die of claim 1 wherein the first plurality of bulk acoustic wave resonators and the second plurality of bulk acoustic wave resonators are film bulk acoustic wave resonators.

6. The multi-filter die of claim 4 wherein the first plurality of bulk acoustic wave resonators each include a raised frame structure.

7. A multi-filter die with bulk acoustic wave filters, the multi-filter die comprising:

a first filter located in a first region of a substrate, the first filter including a first plurality of bulk acoustic wave resonators, and the first filter being a first band pass filter having a first passband; and a second filter located in a second region of the substrate, the second filter including a second plurality of bulk acoustic wave resonators, at least one of the first plurality of bulk acoustic wave resonators having the same resonant frequency as at least one of the second plurality of bulk acoustic wave resonators, the second filter is being second band pass filter having a second passband, and the first passband overlaps with the second passband.

8. The multi-filter die of claim 1 wherein the first filter and the second filter include a common material stack.

9. The multi-filter die of claim 1 wherein a thickness of a piezoelectric layer of the one of the first plurality of bulk acoustic wave resonators is the same as a thickness of a piezoelectric layer of the one of the second plurality of bulk acoustic wave resonators.

10. The multi-filter die of claim 1 wherein a thickness of a lower electrode of the one of the first plurality of bulk acoustic wave resonators is the same as a thickness of a lower electrode of the one of the second plurality of bulk acoustic wave resonators.

11. The multi-filter die of claim 10 wherein the lower electrode of the one of the first plurality of bulk acoustic wave resonators includes a same material as the lower electrode of the one of the second plurality of bulk acoustic wave resonators.

12. A multi-filter die with bulk acoustic wave filters, the multi-filter die comprising:
a first filter located in a first region of a substrate, the first filter including a first plurality of bulk acoustic wave resonators, each of the first plurality of bulk acoustic wave resonators having a resonant frequency; and
a second filter located in a second region of the substrate, the second filter including a second plurality of bulk acoustic wave resonators, each of the second plurality of bulk acoustic wave resonators having a resonant frequency, a difference between resonant frequencies of two bulk acoustic wave resonators of the first plurality of bulk acoustic wave resonators being equal to a difference between resonant frequencies of two bulk acoustic wave resonators of the second plurality of bulk acoustic wave resonators, and each of the resonant frequencies of the first plurality of bulk acoustic wave resonators being different from each of the resonant frequencies of the second plurality of bulk acoustic wave resonators.

13. A multi-filter die with bulk acoustic wave filters, the multi-filter die comprising:
a first filter located in a first region of a substrate, the first filter including a first plurality of bulk acoustic wave resonators, each of the first plurality of bulk acoustic wave resonators having a resonant frequency, and the first plurality of bulk acoustic wave resonators each including a raised frame structure; and
a second filter located in a second region of the substrate, the second filter including a second plurality of bulk acoustic wave resonators, each of the second plurality of bulk acoustic wave resonators having a resonant frequency, a difference between resonant frequencies of two bulk acoustic wave resonators of the first plurality of bulk acoustic wave resonators being equal to a difference between resonant frequencies of two bulk acoustic wave resonators of the second plurality of bulk acoustic wave resonators.

14. The multi-filter die of claim 12 wherein the first and second filters are included in a multiplexer.

15. A multi-filter die with bulk acoustic wave filters, the multi-filter die comprising:
a first filter located in a first region of a substrate, the first filter including a first plurality of bulk acoustic wave resonators, each of the first plurality of bulk acoustic wave resonators having a resonant frequency; and
a second filter located in a second region of the substrate, the second filter including a second plurality of bulk acoustic wave resonators, each of the second plurality of bulk acoustic wave resonators having a resonant frequency, a difference between resonant frequencies of two bulk acoustic wave resonators of the first plurality of bulk acoustic wave resonators being equal to a difference between resonant frequencies of two bulk acoustic wave resonators of the second plurality of bulk acoustic wave resonators, and the multi-filter die is free from electrical connections between the first filter and the second filter.

16. The multi-filter die of claim 12 wherein the first plurality of bulk acoustic wave resonators and the second plurality of bulk acoustic wave resonators are film bulk acoustic wave resonators.

17. The multi-filter die of claim 13 wherein each of the resonant frequencies of the first plurality of bulk acoustic wave resonators are different from each of the resonant frequencies of the second plurality of bulk acoustic wave resonators.

18. A multi-filter die with bulk acoustic wave filters, the multi-filter die comprising:
a first filter located in a first region of a substrate, the first filter including a first plurality of bulk acoustic wave resonators, each of the first plurality of bulk acoustic wave resonators having a resonant frequency, the first filter being a first band pass filter having a first passband; and
a second filter located in a second region of the substrate, the second filter including a second plurality of bulk acoustic wave resonators, each of the second plurality of bulk acoustic wave resonators having a resonant frequency, a difference between resonant frequencies of two bulk acoustic wave resonators of the first plurality of bulk acoustic wave resonators being equal to a difference between resonant frequencies of two bulk acoustic wave resonators of the second plurality of bulk acoustic wave resonators, the second filter being a second band pass filter having a second passband, and the first passband overlaps with the second passband.

19. The multi-filter die of claim 12 wherein the first filter and the second filter are formed using a common material stack.

20. The multi-filter die of claim 15 wherein the first plurality of bulk acoustic wave resonators each include a raised frame structure.

* * * * *